United States Patent
Kuroda et al.

(10) Patent No.: US 7,387,131 B2
(45) Date of Patent: Jun. 17, 2008

(54) PROCESSING APPARATUS AND SUBSTRATE PROCESSING METHOD

(75) Inventors: Osamu Kuroda, Tosu (JP); Hiroki Taniyama, Tosu (JP); Takayuki Toshima, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 367 days.

(21) Appl. No.: 10/353,015

(22) Filed: Jan. 29, 2003

(65) Prior Publication Data
US 2003/0172955 A1 Sep. 18, 2003

(30) Foreign Application Priority Data
Jan. 30, 2002 (JP) .............................. 2002-021563
Mar. 25, 2002 (JP) .............................. 2002-082763

(51) Int. Cl.
| B08B 3/00 | (2006.01) |
| B08B 3/12 | (2006.01) |
| B08B 6/00 | (2006.01) |
| B05C 11/00 | (2006.01) |
| B05C 11/02 | (2006.01) |
| B05C 13/00 | (2006.01) |
| B05C 13/02 | (2006.01) |
| B05C 7/06 | (2006.01) |
| B05C 5/00 | (2006.01) |

(52) U.S. Cl. .................. 134/149; 134/143; 134/147; 134/153; 134/200; 118/32; 118/53; 118/313
(58) Field of Classification Search .................. 134/143, 134/147, 149, 153, 200, 902; 118/52, 313, 118/32, 53
See application file for complete search history.

(56) References Cited

U.S. PATENT DOCUMENTS

| 4,889,069 A | * | 12/1989 | Kawakami ................... 118/50 |
| 5,367,530 A | * | 11/1994 | Noishiki et al. .......... 372/43.01 |
| 5,762,708 A | * | 6/1998 | Motoda et al. ................ 118/52 |
| 5,779,796 A | * | 7/1998 | Tomoeda et al. ............ 118/319 |
| 6,375,741 B2 | * | 4/2002 | Reardon et al. ............. 118/313 |
| 2002/0050281 A1 | | 5/2002 | Oka et al. |

FOREIGN PATENT DOCUMENTS

| JP | 6-120133 | 4/1994 |
| JP | 11-102882 | 4/1999 |
| JP | 2971681 | 8/1999 |

* cited by examiner

Primary Examiner—Michael Barr
Assistant Examiner—Rita R Patel
(74) Attorney, Agent, or Firm—Smith, Gambrell & Russell, LLP

(57) ABSTRACT

A substrate processing apparatus for processing a substrate With a processing fluid is provided. The apparatus includes holding members 60 for holding the substrate W, a chuck member 61 for supporting the holding members 60 and a top-face member 62 approaching the substrate W to cover its surface. In arrangement, since the top-face member 62 is supported by the chuck member 61, the holding members 60 can rotate together with the top-face member 62 in one body. With this structure, it is possible to reduce the influence of particles on the substrate W and also possible to provided a low-cost substrate processing apparatus occupied as little installation space as possible.

8 Claims, 20 Drawing Sheets

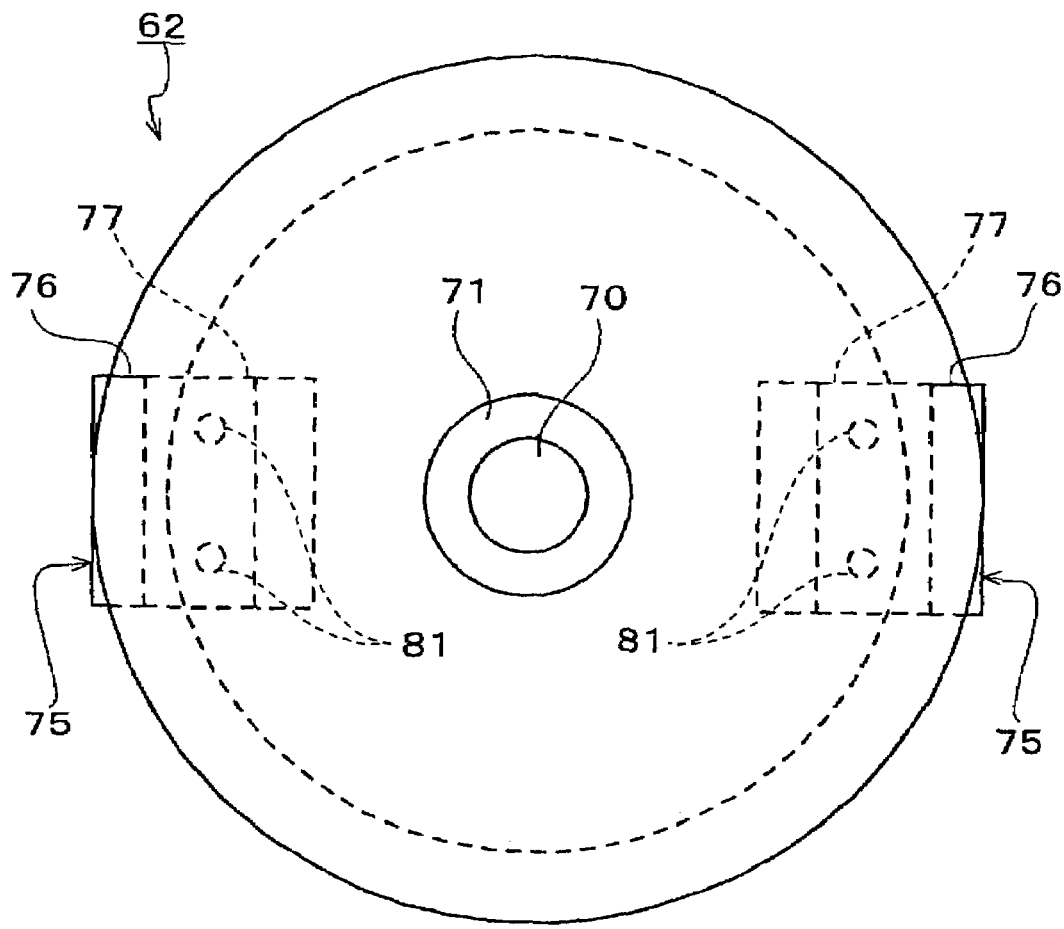
F I G. 6
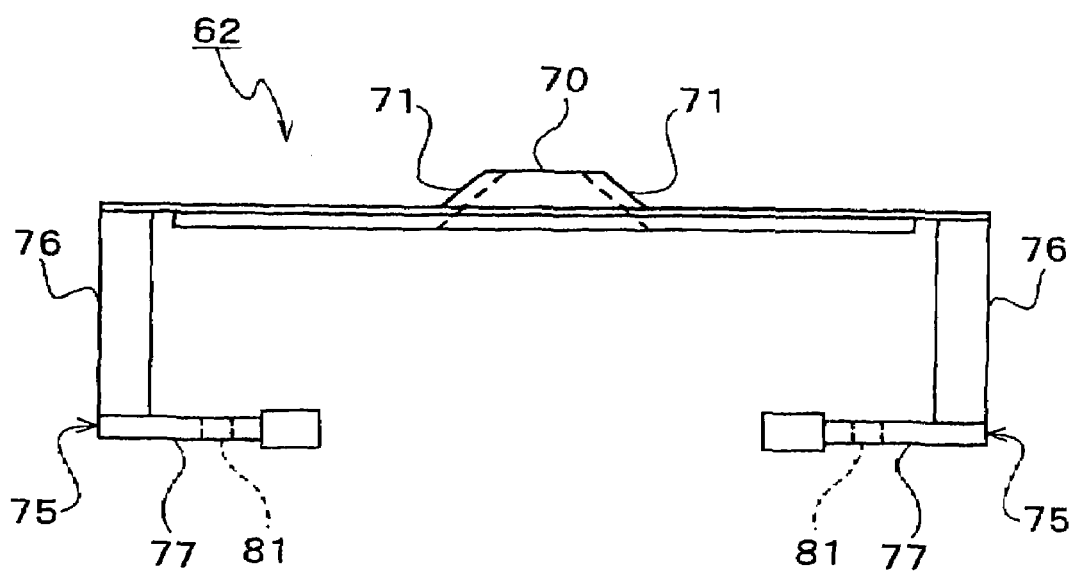
F I G. 7

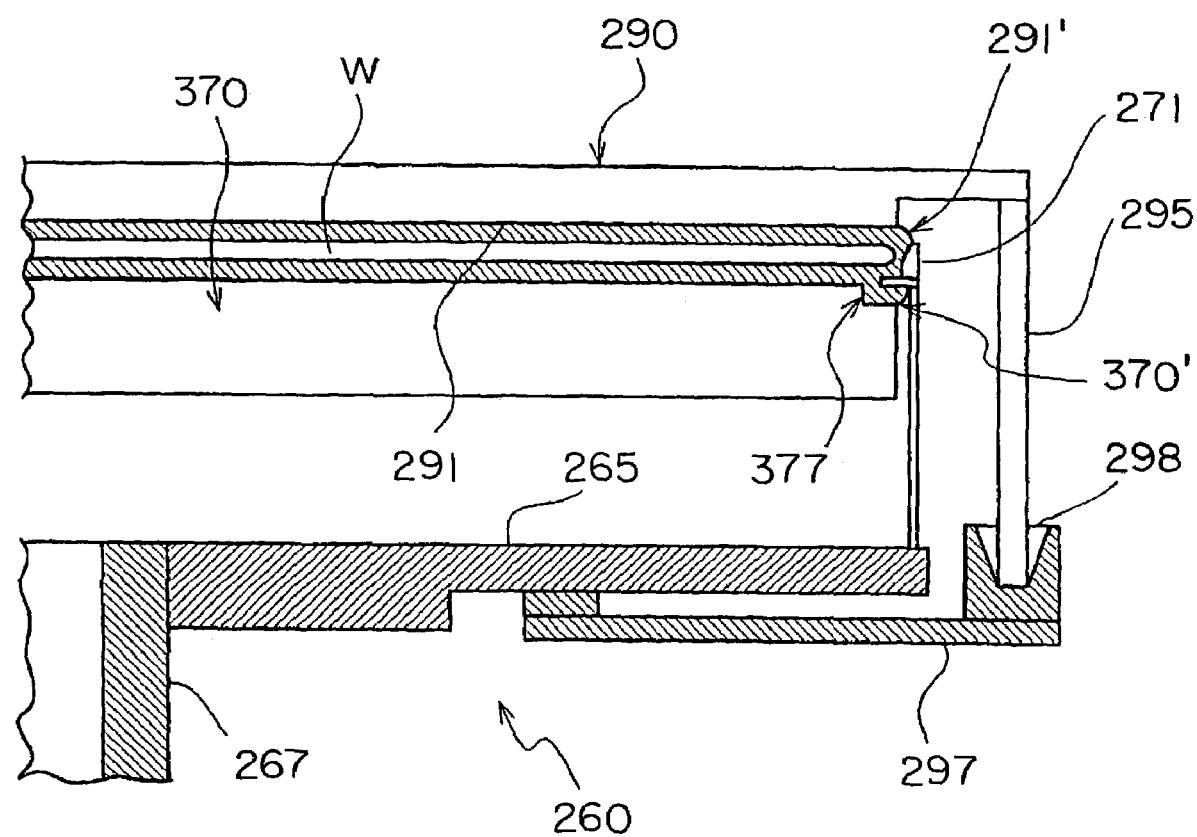
F I G. 16

PROCESSING APPARATUS AND SUBSTRATE PROCESSING METHOD

BACKGROUND OF THE INVENTION

1. Technical Field of the Invention

This invention relates to substrate processing apparatus and method for processing (e.g. cleaning) a substrate, for example, semiconductor wafer, glass for LCD substrate, etc.

2. Description of the Related Art

In the manufacturing process of semiconductor devices, a processing system is used to apply a specific processing (e.g. cleaning, removing of resist film) on the surfaces of a semiconductor water. Noted that the semi conductor water will be referred "wafer", hereinafter. As a substrate processing apparatus provided in the above processing system, there is known a single wafer processing apparatus adapted to supply a processing liquid to a wafer being held horizontally. In view of the prevention of contamination of a wafer by particles and also the reduction of consumption of the processing liquid, the conventional single wafer processing apparatus is provided with a plate-shaped top-face member which gives access to an upper surface of the wafer. In processing the wafer, this plate-shaped top-f ace member is brought into a close position against the upper surface of the wafer as if the whole upper surface of the wafer were covered with the upper. Of course, the top-f ace member is adapted to be approachable and separable from the upper surf ace of the wafer. When the wafer is loaded into and unloaded from the wafer processing apparatus, the top-face member is withdrawn from a predetermined "substrate-processing" position thereof. In processing a wafer, the top-face member is driven to approach the wafer to define a gap between the upper surface of the wafer and the upper member. Supplied into this gap are chemical liquids, dry gas and so on. In this way, by supplying processing fluid (liquid, gas, etc.) into the gap, there has been attempted a measure to reduce the consumption of the processing fluid as possible, up to this day.

As for the above-mentioned wafer processing apparatus, if the above top-face member is constructed to be rotatable, there would be produced an effect to improve its cleaning capability and drying capability. However, if the apparatus is provided with respective rotating mechanisms to rotate the wafer and the top-face member individually, then the apparatus becomes big to increase its installation cost. Additionally, if the rotating mechanism to rotate the top-face member is arranged above the "substrate-processing" position, it is feared that particles from the rotating mechanism invade the surroundings of the wafer. Also, if an actuating cylinder for moving the top-face member up and down is disposed above the "substrate-processing" position, then there is a fear that particles from the actuating cylinder invade the surroundings of the wafer, as well. Again, if it is required to supply a processing fluid onto the upper surface of the wafer while the top-face member is adjacent to the wafer, a rotating shaft of the rotating mechanism for the top-face member has to be provided with a fluid passage penetrating the rotating shaft in order to supply the processing fluid to the wafer.

SUMMARY OF THE INVENTION

Under such a circumference as mentioned above, an object of the present invention is to provide substrate processing apparatus and method by which it becomes possible to realize both space-saving and low cost about the installation of the apparatus with a reduced influence of the particles on a substrate.

In order to attain the above object to be solved, a substrate processing apparatus for processing a substrate with a processing fluid comprises a spin chuck for holding the substrate and a top-face member which is capable of approaching the substrate so as to cover an upper surface thereof, wherein the top-face member is supported by the spin chuck, whereby the top-face member can rotate in integral with the spin chuck.

According to an invention, the spin chuck includes holding members for holding the substrate and a chuck member for supporting the holding members, and the top-face member is fixed with chuck member inseparably.

In the above substrate processing apparatus, since the number of rotating mechanisms is reduced, it is possible to miniaturize the substrate processing apparatus and also possible to reduce the cost to be allocated for the rotating mechanisms. With the reduction in number of the rotating mechanisms, quantity of particles produced from the rotating mechanisms can be decreased accordingly.

According to an invention, the substrate processing apparatus further comprises a "top-face member" elevating mechanism for moving the top-face member down to a position close to the substrate and also moving the top-face member up to another position apart from the substrate. Then, in comparison with the conventional apparatus employing an actuating cylinder etc., a narrower gap can be easily formed between the top-face member and the upper surface of the substrate and furthermore, an interval of the gap can be stabilized. Thus, since the processing fluid is supplied into the gap being stable and narrower than a gap of the conventional apparatus, it is possible to save the consumption of the processing fluid, accomplishing an effective processing on the substrate.

According to an invention, the substrate processing apparatus further comprises a guide pin arranged on the chuck member and a "top-face member" supporting member for supporting the top-face member above the substrate, the "top-face member" supporting member being slidable against the guide pin, wherein the "top-face member" elevating mechanism includes a push-up member for pushing the "top-face member" supporting member upward.

According to an invention, the substrate processing apparatus further comprises a rotating mechanism for rotating the chuck member, wherein the rotating mechanism and the "top-face member" elevating mechanism are arranged below the substrate. Then, since no source of the outbreaks of particles is present above the substrate, it is possible to reduce the influence of particles on the substrate.

According to an invention, the substrate processing apparatus further comprises a processing-fluid nozzle for supplying the processing fluid to the substrate, wherein the top-face member is provided, at a center thereof, with a supply port which allows passage of the processing fluid supplied from the processing-fluid nozzle to the substrate.

According to an invention, the processing-fluid nozzle is arranged so as to have its lowermost point deviated from the upside of the supply port and the top-face member is adapted so as to receive the processing fluid falling from the processing-fluid nozzle, at a peripheral part of the supply port. Then, it is possible to discharge the processing fluid, which has been left in the processing-fluid nozzle after ejection, without falling on the substrate.

According to an invention, the substrate processing apparatus further comprises a purge-gas nozzle for supplying an upper part of the top-face member with a purge gas.

According to an invention, the substrate processing apparatus further comprises an under-face member which is capable of approaching the substrate from its underside so as to cover a lower surface of the substrate and an "under-face member" elevating mechanism for moving the under-face member up to a position close to the substrate and also moving the under-face member down to another position apart from the substrate.

According to an invention, the substrate processing apparatus further comprises a rotating mechanism for rotating the chuck member, the rotating mechanism having a cylinder supporting the chuck member and an "under-face member" shaft penetrating a cavity defined in the cylinder to support the under-face member, wherein the cylinder is provided with an "inert-gas" supply passage for supplying an inert gas to a gap between the chuck member and the under-face member and/or the cavity.

According to an invention, the substrate processing apparatus further comprises an exhaust port which opens at the same height as the substrate in rotation thereby to discharge an atmosphere flowing toward the circumference of the substrate. Then, it is possible to discharge the processing fluid etc. flowing toward the circumference of the substrate due to centrifugal force, smoothly.

According to an invention, in the substrate processing apparatus, the top-face member is constructed so as to be engageable with the spin chuck, whereby the top-face member is engaged with the spin chuck for their rotation in one body. In this substrate processing apparatus, there can be established one process for the substrate on condition that the top-face member approaches the upper surface of the substrate and rotates together with the substrate and another process for the substrate on condition that the top-face member is separated from the substrate.

According to an invention, either one of the top-face member and the spin chuck is provided with an engagement concave portion, while the other of the top-face member and the spin chuck is provided with an engagement convex portion. In connection, the engagement concave portion is adapted so as to engage with the engagement convex portion when the top-face member is lowered to the spin chuck, and the engagement concave portion is adapted so as to separate from the engagement convex portion when the top-face member is elevated from to the spin chuck. In connection, the engagement concave portion and/or the engagement convex portion is provided with at ape red part to facilitate insertion of the engagement concave portion. In this case, because of the top-face member's own weight, the spin chuck can support it. In the arrangement where the engagement convex portion is engaged with the engagement concave portion from its upside or underside, the engagement between the engagement convex portion and the engagement concave portion can be maintained even when the spin chuck rotates in a horizontal plane.

According to an invention, the substrate processing apparatus further comprises a "top-face member" elevating mechanism for moving the top-face member down to a position engaging with the spin chuck and also moving the top-face member up to another position separating from the spin chuck.

According to an invention, the "top-face member" elevating mechanism includes a supporting member for supporting the top-face member separated from the spin chuck.

In connection, the top-face member is provided with an engagement part engageable with the supporting member. Further, the engagement part is engaged with or disengaged from the supporting member while the top-face member is engaged with spin chuck.

According to an invention, the engagement-and-disengagement between the engagement part and the supporting member is accomplished by rotating the top-face member and the spin chuck relatively to each other. Then, since the engagement-and-disengagement between the engagement part and the supporting member is carried out by using the rotating mechanism for the spin chuck, there is no need to provide an exclusive driving mechanism for the above engagement-and-disengagement.

According to an invention, the "top-face member" elevating mechanism includes a clamp mechanism for gripping the top-face member.

According to an invention, the top-face member is provided, at a center thereof, with a supply port that allows passage of the processing fluid supplied to the substrate. Then, in a state where the top-face member approaches the substrate to form a gap therebetween, it is possible to supply the processing fluid into the gap.

According to an invention, the substrate processing apparatus further comprises at least one processing-fluid nozzle for supplying the processing fluid to the substrate, and an arm for transferring the processing-fluid nozzle, above the substrate, at least from the center of the substrate to the periphery of the substrate. With this constitution, when separating the top-face member from the spin chuck, it is possible to move the processing-fluid nozzle into a space defined between the upper surface of the substrate and the top-face member while rotating the substrate by the spin chuck. Therefore, for example, when allowing the processing fluid to be ejected by the processing-fluid nozzle that is moving over the rotating substrate, it becomes possible to supply the whole upper surface of the substrate with the processing fluid.

According to an invention, the processing-fluid nozzle is adapted so as to eject a mixture of the processing fluid and gas to the substrate.

According to an invention, the arm is adapted so as to move the processing-fluid nozzle upward of the substrate while the spin chuck is being separated from the top-face member. Thus, by rotating the substrate while the processing fluid is being ejected from the processing-fluid nozzle, it is possible to supply the whole upper surface of the substrate with the processing fluid.

According to an invention, the substrate processing apparatus further comprises a chamber surrounding the substrate, the spin chuck and the top-face member, a "processing-fluid nozzle" storage part for storing the processing-fluid nozzle hermetically, and a closable opening to transfer the processing-fluid nozzle from the "processing-fluid nozzle" storage part into the chamber.

According to an invention, the substrate processing apparatus further comprises an under-face member which is relatively elevated to the backside of the substrate to approach it and which is lowered to separate from the substrate.

According to an invention, there is also provided a substrate processing method for processing a substrate with a processing fluid, comprising the steps of: elevating a top-face member which is capable of approaching the substrate so as to cover a surface thereof; holding the substrate by holding members; lowering the top-face member so as to approach the surface of the substrate; rotating the holding members and the top-face member in one body thereby processing the substrate; subsequently stopping rotation of the substrate, the holding members and the top-face member; elevating the top-face member; and unloading the substrate from the holding member.

According to an invention, the processing fluid is supplied into a gap between the top-face member and the substrate, thereby processing the substrate.

According to an invention, an upper side of the top-face member is supplied with air during processing the substrate.

According to an invention, an under-face member is brought close to the backside of the substrate during processing the substrate.

According to an invention, there is also provided a substrate processing method for processing a substrate with a processing fluid, comprising the steps of:

holding the substrate by a spin chuck while elevating a top-face member; lowering the top-face member closer to the top face of the substrate to engage the top-face member with the spin chuck and successively supplying the processing fluid into a gap defined between the top-face member and the substrate thereby processing the substrate while carrying out a first rotation to rotate the substrate, the spin chuck and the top-face member in one body; stopping the first rotation of the substrate, the spin chuck and the top-face member; elevating the top-face member away from the spin chuck and further processing the substrate while carrying out a second rotation to rotate the substrate and the spin chuck in one body; stopping the second rotation of the substrate and the spin chuck; and stopping holding the substrate by the spin chuck.

According to an invention, the substrate processing method further comprises, between the step of stopping the second rotation and the step of canceling the holding of the spin chuck for the substrate, the steps of: again lowering the top-face member closer to the top face of the substrate to engage the top-face member with the spin chuck; supplying the processing fluid into a gap defined between the top-face member and the substrate thereby processing the substrate while carrying out a third rotation to rotate the substrate, the spin chuck and the top-face member in one body; and stopping the third rotation of the substrate, the spin chuck and the top-face member and successively elevating the top-face member away from the spin chuck.

According to an invention, the above step of supplying the processing fluid into the gap defined between the top-face member and the substrate includes the step of making the top-face member in contact with the processing fluid supplied to the upper surface of the substrate.

According to an invention, the above step of supplying the processing fluid into the gap defined between the top-face member and the substrate includes the step of making the top-face member in non-contact with the processing fluid supplied to the upper surface of the substrate.

According to an invention, the above step of elevating the top-face member away from the spin chuck and further processing the substrate while rotating the substrate and the spin chuck in one body includes the step of transferring the processing-fluid nozzle, between the top-face member and the substrate, at least from the center of the substrate to the periphery of the substrate, thereby supplying the substrate rotating with the processing fluid through the processing-fluid nozzle.

According to an invention, the above step of processing the substrate further includes the steps of: elevating an under-face member closer to the lower surface of the substrate; and successively supplying the processing fluid into a gap defined between the under-face member and the substrate thereby processing the lower surface of the substrate.

BRIEF DESCRIPTION OF THE DRAWINGS

FIG. 6 is a plan view of the top plate of FIG. 4;

FIG. 7 is an elevational view of the top plate of FIG. 4;

FIG. 16 is an explanatory view explaining the engagement of an engagement convex member with an engagement concave member;

DESCRIPTION OF THE PREFERRED EMBODIMENT

Figure 1:
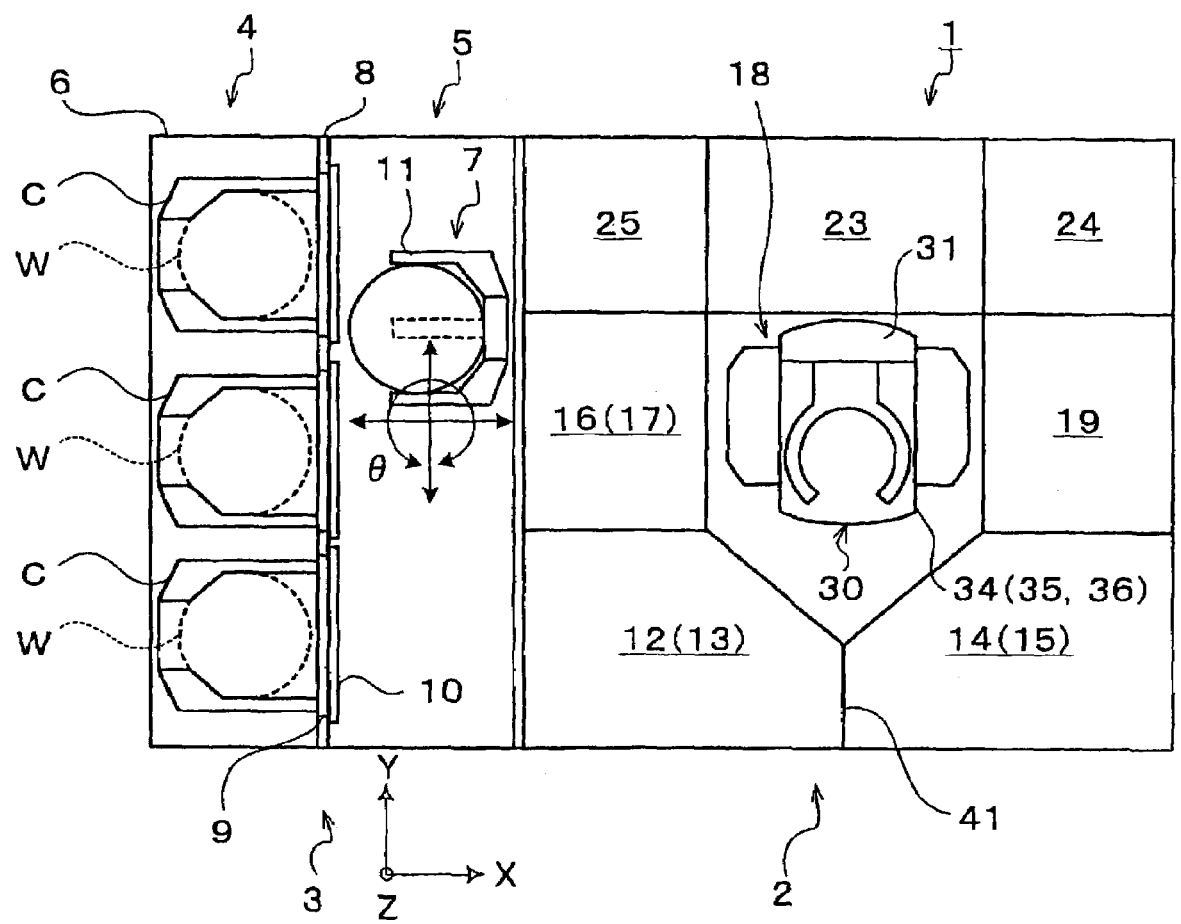
FIG. 1 is a plan view of a cleaning system of the present invention.
Figure 2:
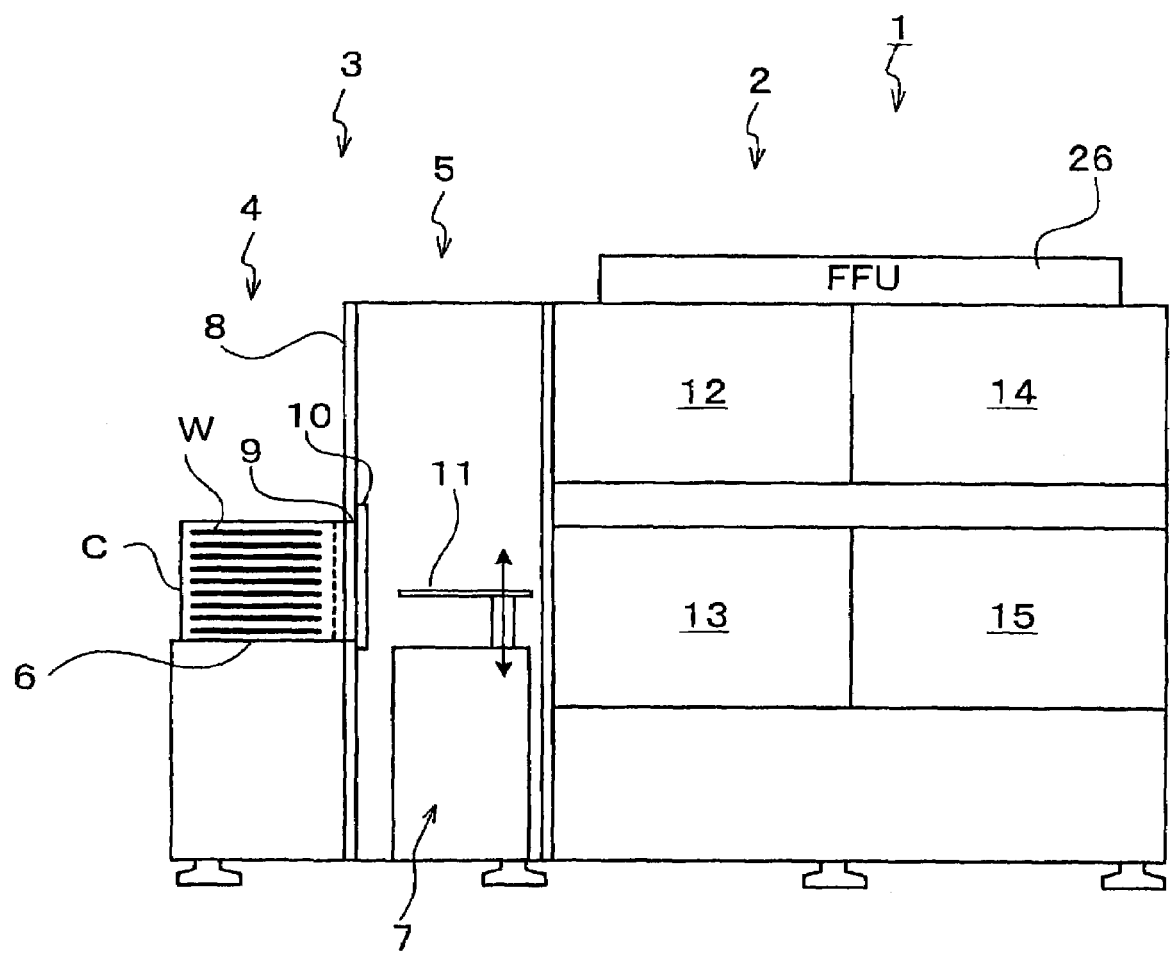
FIG. 2 is a side view of the cleaning system of FIG. 1.

Based on a substrate cleaning unit (as the substrate processing apparatus) which is constructed so as to clean of a wafer (as one example of substrate), preferred embodiments of the present invention will be described below. FIG. 1 is a plan view of the cleaning system 1 having built-in substrate cleaning units 12, 13, 14, 15 in accordance with the embodiments of the invention. FIG. 2 is a side view of FIG. 1. The cleaning system 1 includes a cleaning part 2 for carrying out a cleaning process for wafers W and sequent heat treatment after the cleaning process and a loading/unloading part 3 for loading and unloading the wafers W to and from the cleaning part 2.

The loading/unloading part 3 is formed by an in/out port 4 provided with a mounting table 6 for mounting a container (carrier C) thereon and a wafer-transfer part 5 equipped with a wafer transfer unit 7 for carrying out the delivery of wafer between the carrier C mounted on the mounting table 6 and a cleaning part 2. The carrier C is capable of accommodating a plurality of wafers W (for example, twenty-five wafers) generally horizontally, at predetermined intervals.

The wafers W are loaded or unloaded through one side face of the carrier C. The carrier C is provided, on the side face, with a lid body that can open and shut the carrier. The carrier C has a plurality of shelf plates formed on its inner wall to retain the wafers W thereon at predetermined intervals, providing twenty-five slots for accommodating the wafers therein. While positioning the wafers' surfaces (i.e. surfaces for forming semiconductor devices) so as to face upward, the wafers W are accommodated in the slots, one by one.

The mounting table 6 of the in/out port 4 is capable of mounting e.g. three carriers C juxtaposed in a direction Y on the horizontal plane of the table, at predetermined positions. The carriers C are mounted on the table 6 so that their side faces having the lid bodies face a boundary wall 8 between the in/out port 4 and the wafer transfer part 5. The boundary wall 8 is provided, at positions corresponding to the mounting positions of the carriers C, with windows 9. On each window's side facing the wafer transfer part 5, there is arranged a window opening mechanism 10 that opens and closes the corresponding window 9 by means of a shutter etc.

This window opening mechanism 10 is also capable of opening and closing the lid body of the carrier C. The window opening mechanism 10 opens or closes the lid body of the carrier C at the same time of opening or closing the window 9. When the window 9 is opened to communicate the loading/unloading port of the carrier C with the wafer transfer part 5, it becomes possible for the wafer transfer unit 7 in the wafer transfer part 5 to obtain access to the carrier C, allowing of the transportation of the wafer W.

The wafer transfer unit 7 in the wafer transfer part 5 is movable in both Y-direction and Z-direction and also rotatable in a plane of X-Y (θ-direction). The wafer transfer unit 7 includes a pickup/accommodating arm 11 for grasping the wafer W. The pickup/accommodating arm 11 is slidable in a direction of X. In this way, the wafer transfer unit 7 can obtain access to a slot at any height of all the carriers C mounted on the mounting table 6. Also, the unit 7 can obtain access to two upper and lower wafer delivery units 16, 17 arranged in the cleaning part 2, exhibiting the possibility to transfer the wafer W from the in/out port 4 to the cleaning part 2, and vice versa.

The cleaning part 2 includes a main wafer transfer unit 18, two wafer delivery units 16, 17, four substrate cleaning units 12, 13, 14, 15 of the embodiments, and a heating and cooling part 19 consisting of three heating units for heating the wafers W after cleaning and a cooling unit for cooling the heated wafers W. The main wafer transfer unit 18 is arranged to give access to all of the wafer delivery units 16, 17, the substrate cleaning units 12, 13, 14, 15, the heating and cooling part 19.

In the cleaning part 2, there are arranged a battery unit 23 as a power source for working the whole cleaning system 1, a mechanical control unit 24 for controlling the operations of various sorts of devices in the cleaning system 1 and also the operation of the system 1 as a whole, and a chemical storage unit 24 for storing designated cleaning liquids to be supplied to the substrate processing units 12, 13, 14, 15. The battery unit 23 is connected with a not-shown main power source. On the ceiling part of the cleaning part 2, a fan filter unit (FFU) 26 is provided in order to supply the above units and the main wafer transfer unit 18 with downflow of fresh air.

By either arranging the battery unit 23, the chemical storage unit 25 and the mechanical control unit 24 outside the cleaning part 2 or withdrawing these units 23, 24, 25 from the part 2, the arrangement facilitates maintenance of the wafer delivery units 16, 17, the main wafer transfer unit 18, the heating and cooling part 19, from this plane (Y-direction).

The wafer delivery units 16, 17 are provided to temporarily mount the wafer W thereon in order to accomplish the delivery of the wafer W between the units 16, 17 and the wafer transfer part 5. The wafer delivery units 16, 17 are stacked up in two stages up and down. For example, the wafer delivery unit 17 on the lower stage is used to mount the wafer W to be transferred from the in/out port 4 to the cleaning part 2, while the wafer delivery unit 16 on the upper stage is used to mount the wafer W to be transferred from the cleaning part 2 to the in/out port 4.

Part of the downflow flowing from the fan filter unit (FFU) 26 passes through the wafer delivery units 16, 17 and also their upside space and flows into the wafer transfer part 5. Consequently, it is possible to prevent particles etc. from invading the cleaning part 2 through the wafer transfer part 2, thereby maintaining the cleanness in the cleaning part 2.

The main wafer transfer unit 18 includes a cylindrical holder 30 which can rotate owing to the rotational driving force of a not-shown motor and a wafer transfer body 31 which can move up and down in the direction of Z along the inside of the holder 30. The wafer transfer body 31 is rotated in a body with the holder 30. The wafer transfer body 31 is equipped with three transfer arms 34, 35, 36 which are arranged in multistage and also movable in front and in the rear independently of each other.

As shown in FIG. 2, the substrate cleaning units 12, 13, 14, 15 are arranged in the system 1, in two stages up and down and two units per stage. As shown in FIG. 1, the substrate cleaning units 12, 13 and the substrate cleaning units 14, 15 are symmetrical to each other on both sides of a wall 41 as the boundary of symmetry. Except this symmetrical arrangement, these substrate cleaning units 12, 13, 14, 15 are provided with structures similar to each other. Therefore, the detailed structures will be described below, by example of the substrate cleaning unit 12.

Figure 3:
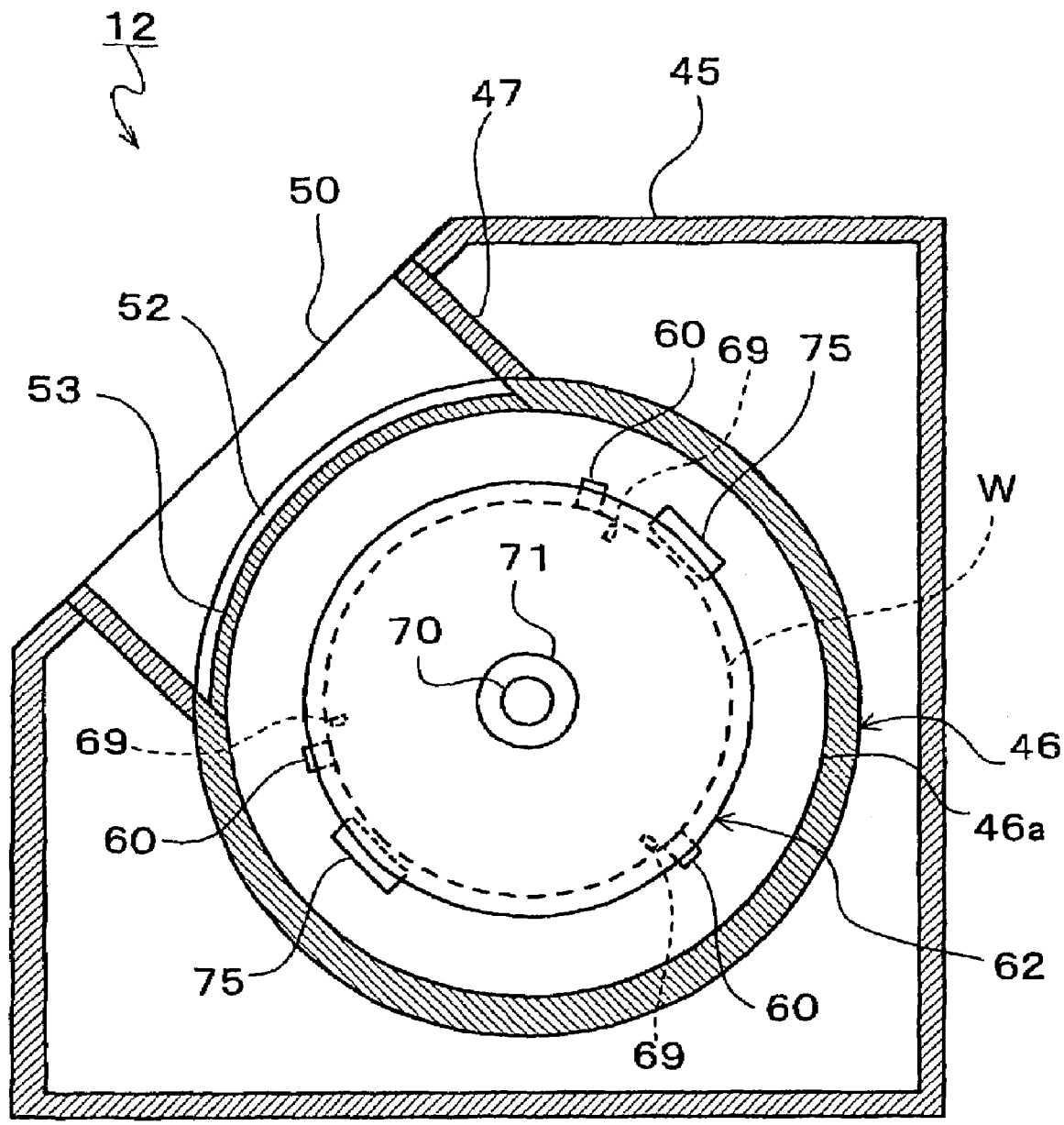
FIG. 3 is a plan view of a substrate processing apparatus in accordance with the first embodiment of the present invention.

FIG. 3 is a plan view of the substrate cleaning unit 12 in accordance with the first embodiment of the present invention. A unit chamber 45 of the substrate cleaning unit 12 includes an outer chamber 46 in which the wafer W is accommodated for processing with a processing fluid, forming a substrate processing part. The outer chamber 46 is adapted so as to surround the wafer W from its vicinity and upside. The outer chamber 46 has a annular sidewall 46a for surrounding the circumference of the wafer W and a ceiling part 46b for covering the upside of the wafer W to isolate an atmosphere about and above the wafer W from an atmosphere outside the outer chamber 46. The unit chamber 45 has an opening 50, while the outer chamber 46 has an opening 52 formed in the sidewall 46a to communicate with the opening 50 through an opening 47. The outer chamber 45 is provided with an "outer-chamber" mechanical shutter 53 that can open and close the opening 52 owing to a cylinder driving mechanism 54 consisting of an air cylinder etc. For example, when the transfer arm 34 transfers the wafer W into or from the outer chamber 46 through the opening 47, the "outer-chamber" mechanical shutter 53 opens. This mechanical shutter 53 is constructed so as to open and close the opening 52 on the interior side of the outer chamber 46. Therefore, even if a positive pressure is formed in the outer chamber 46, there is no possibility that an atmosphere inside the outer chamber 46 leaks out.

Figure 4:
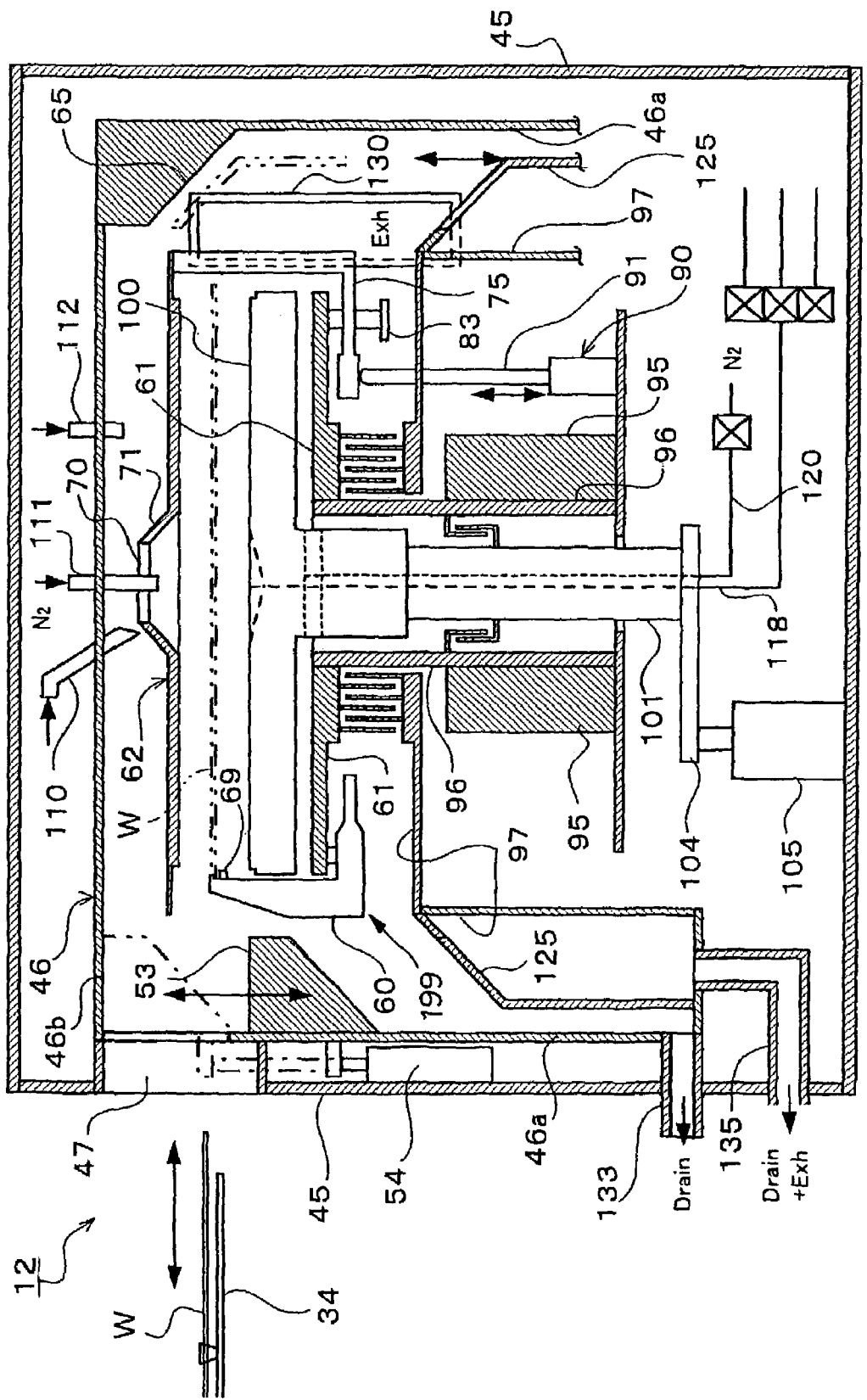
FIG. 4 is a longitudinal sectional view of the substrate processing apparatus in accordance with the first embodiment of the present invention.

In the outer chamber 46, as shown in FIG. 4, there are holding members 60 for holding the wafer W substantially horizontally, a chuck plate 61 (as the chuck member) for supporting the holding members 60, rotary cylinder 96 as described below and a top plate 62 (as the top-face member) which approaches the wafer W supported by the holding members 60 to cover the upper surface of the wafer W. The holding member 60, the chuck plate 61 and the rotary cylinder 96 compose a spin chuck 199. The wafer W is carried while the wafer's processing surface for a semiconductor device orientates upward. On the sidewall 46a of the outer chamber 46, an inclined part 65 is formed at the level of the wafer W held by the holding members 60, so that the wafer W is surrounded by the inclined part 65. The "outer-chamber" mechanical shutter 53 forms part of the inclined part 65. When giving and receiving the wafer W to and from the spin chuck 199, it is carried out to open the "outer-chamber" mechanical shutter 53 and successively move the wafer W horizontally.

Figure 5:
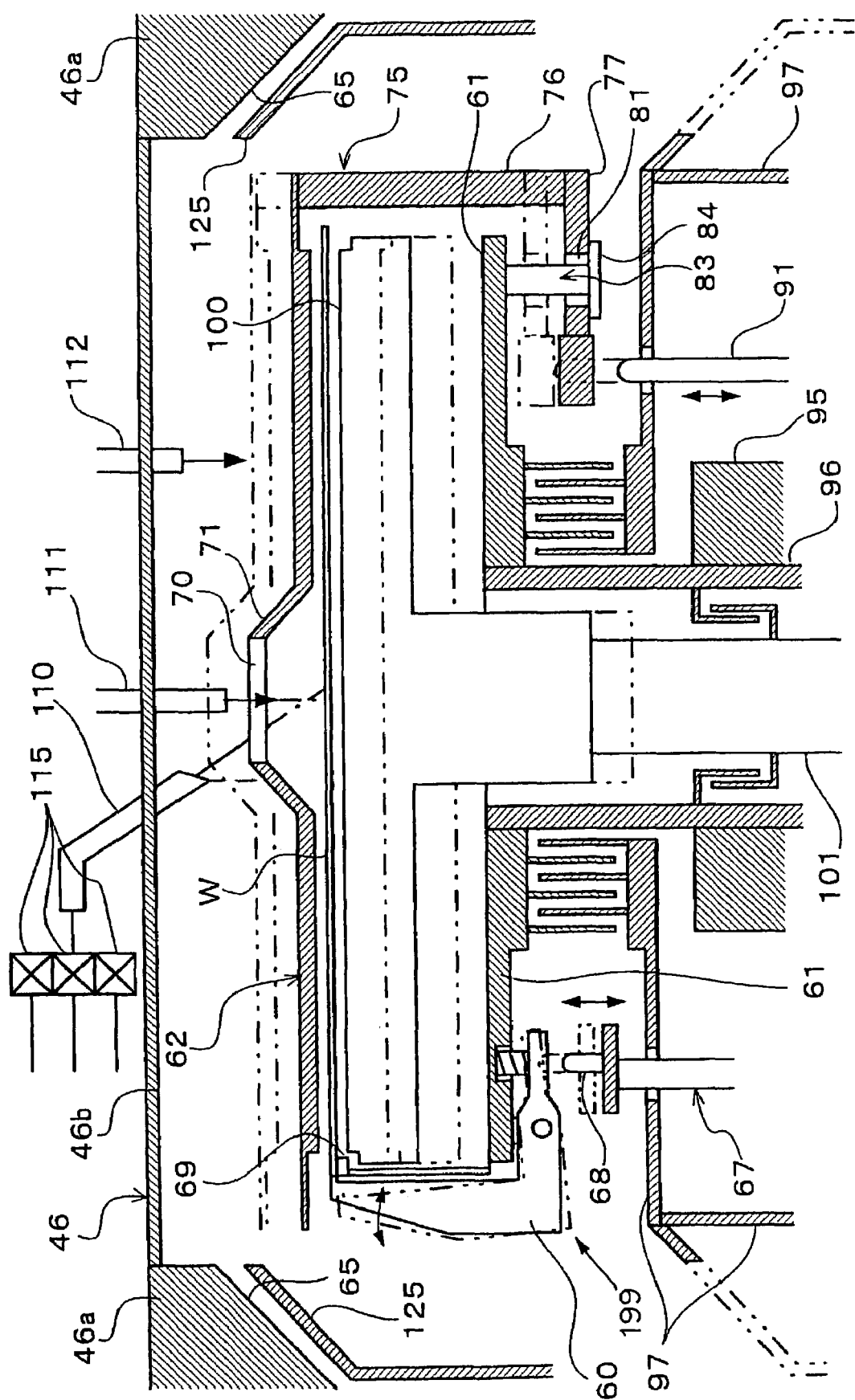
FIG. 5 is a view explaining respective movements of a top plate, an under plate, an inner cup, a holding member, etc. all forming the substrate processing apparatus of the embodiment.

As shown in FIG. 3, the holding members 60 are arranged at intervals of 120 degrees in the circumference of the chuck plate 61. Thus, these members 60 can hold the periphery of the wafer W. Each of the holding members 60 is L-shaped and adapted so as to pivot against the chuck plate 61 in a substantially-vertical plane since the member's bent portion is rotatably attached to the periphery of the chuck plate 61. Between a horizontal portion of the holding member 60 and the chuck plate 61, a compression spring is arranged to urge the member's bent vertical portion of the member 60 toward the periphery of the wafer W. As shown in FIG. 5, three holding members 60 are switched between a state to hold the wafer W (solid line) and a state to release the wafer W (chain line) by a release mechanism 67. The release mechanism 67 lifts up a "holding-member" opening pin 68 by means of an elevating mechanism having a not-shown air cylinder to push up the horizontal portion of each holding member 60. In this way, the holding of the wafer W can be canceled by spreading the vertical portions of three holding members 60 simultaneously.

The chuck plate 61 is provided with three support pins 69 which support the back surface of the wafer W above a main body of the chuck plate 61. As shown in FIG. 3, three support pins 69 are arranged at intervals of 120 degrees on the back side of the wafer W. For example, when loading the wafer W, the holding of the holding members 60 is canceled and the periphery of the wafer W is supported, on the back side, by the support pins 69. Subsequently, the holding members 60 support the periphery of the wafer W. The chuck plate 61 is arranged substantially horizontally. The wafer W is supported by three support pins 69 and also held by three holding members 60, in parallel with the chuck plate 61.

The top plate 62 is formed with a size allowing for covering the surface of the wafer W. At the center of the plate 62, a supply hole 70 is formed to provide a passage of the processing fluid to be supplied to the wafer W. The processing fluid is supplied from the upside of the supply hole 70 to the vicinity of the center of the wafer W. The top plate 62 is provided, around the supply hole 70, with a tapered part 71 that inclines from the center side of the top plate 62 toward the circumference downward. The top plate 62 further includes two "top-plate" supporting members 75 arranged in opposed-positions about the outer edge of the plate 62. As shown in FIGS. 6 and 7, each "top-plate" supporting member 75 is formed by a vertical supporting member 76 connected to the lower surface of the top plate 62 perpendicularly and a parallel supporting member 77 connected with the lower end of the vertical supporting member 76 and also paralleled with the top plate 62. The parallel supporting member 77 is provided with guide holes 81 through which guide pins 83 on the bottom of the chuck plate 61 penetrate.

Along the guide pins 83, each parallel supporting member 77 is slidable between the lower surface of the chuck plate 61 and respective upper surfaces of stoppers 84 of the guide pins 83. The vertical supporting members 76 are arranged on the outer peripheral side of the wafer W, preventing the members 76 from interfering with the wafer W in spite of the slide movement of the parallel supporting members 77 along the guide pins 83. As shown in FIG. 5, the guide pins 83 are arranged to be perpendicular to the chuck plate 61. The upper end of each guide pin 83 is fixed on the lower surface of chuck plate 61. The guide pin 83 penetrating the guide hole 81 is provided, on the lower end, with the stopper 84. Since the lower surfaces of the parallel supporting members 77 abut on the upper surfaces of the stoppers 84, the "top-plate" supporting members 75 can be prevented from falling from the guide pins 83. That is, the chuck plate 61 supports the "top-plate" supporting members 75 through the guide pins 83, while the top plate 62 is supported by the chuck plate 61 through the "top-plate" supporting member 75. The guide holes 81 and the guide pins 83 are provided for the parallel supporting members 77 two each, respectively. Consequently, the parallel supporting members 77 are respectively carried in parallel with the chuck plate 61, while the vertical supporting members 76 are respectively carried to be perpendicular to the lower surface of the chuck plate 61 and also the upper surface of the wafer W, whereby the lower surface of the top plate 62 becomes parallel with the upper surface of the wafer W. Further, even when the parallel supporting members 77 slide along the guide pins 83, the parallel supporting members 77 move up and down while always maintaining their parallel relationship with the lower surface of the chuck plate 61, the vertical supporting members 76 moving up and down while always maintaining their perpendicular relationship to the lower surface of the chuck plate 61 and the upper surface of the wafer W, and the top plate 62 also moves up and down while always maintaining its lower surface in parallel with the upper surface of the wafer W.

As shown in FIG. 4, the substrate cleaning unit 12 includes a "top-plate" elevating mechanism 90, such as air cylinder, for elevating the top plate 62 and a motor 95 for rotating the chuck plate 61. The "top-plate" elevating mechanism 90 and the motor 95 are together disposed in a "driving-mechanism" chamber 97 formed below the wafer W held by the holding members 60. Also, the release mechanism 67 is disposed in the "driving-mechanism" chamber 97. Since the peripheries and upsides of the "top-plate" elevating mechanism 90, the motor 95 and the release mechanism 67 are surrounded by the chamber 97, it is possible to prevent particles produced from these mechanisms from invading the wafer W. Additionally, since an "under-plate" elevating mechanism 105 is arranged below the chamber 97, it is also possible to prevent particles produced from this mechanism from invading the wafer W.

The "top-plate" elevating mechanism 90 includes a push-up member 91 to push the "top-plate" supporting members 75 upward. In operation, the mechanism 90 moves the push-up member 91 against the parallel supporting members 77 up and down. The push-up member 91 penetrates the "top-plate" elevating mechanism 90 and is arranged so as to stand ready below the parallel supporting member 77. As shown in FIG. 5, since the rise of the push-up member 91 causes each parallel supporting member 77 to rise along the guide pins 83, the top plate 62 is elevated to secede from the wafer W. While, since the fall of the push-up member 91 causes each parallel supporting member 77 to abut on the stoppers 84, the top plate 62 is lowered to a position close to the wafer W (i.e. processing position). In this way, with the push-up member 91 moving up and down, the "top-plate" elevating mechanism 90 allows the top plate 62 to fall to the position close to the wafer W and rise to a position apart from the wafer W (i.e. withdrawal position). Owing to the provision of the push-up member 91 movable below the wafer W to move the top plate 62 up and down, it is possible to arrange the "top-plate" elevating mechanism 90 below the wafer W. Therefore, it is possible to prevent particles in the mechanism 90 from adhering to the wafer W. Noted that when bringing the top plate 62 close to the upper surface of the wafer W, the guide pins 83 support the top plate 62. Thus, in comparison with the conventional case of bringing the top plate 62 close to the wafer W by means of cylinder etc., it is possible to define a narrow gap between the top plate 62 and the upper surface of the wafer W and also possible to settle a clearance of the gap. Since the processing fluid is supplied into the narrow and stable gap, it is possible to reduce the consumption of the processing fluid, accomplishing an effective process on the wafer W.

The motor 95 is equipped with a rotary cylinder 96 connected with the bottom of the chuck plate 61. By rotating the rotary cylinder 96, the motor 95 can rotate the chuck plate 61. Since the chuck plate 61 supports the holding members 60 and the top plate 62, the rotation of the rotary cylinder 96 allows the holding members 60, the chuck plate 61 and the top plate 62 to be rotated in one body. In the arrangement of holding the wafer W by the holding members 60, they rotate together with the wafer W, the chuck plate 61 and the top plate 62 integrally. In this way, since the motor 95 rotates the wafer W and the top plate 62 in a body, there is no need to provide an additional rotating mechanism for rotating the top plate 62. Therefore, it is possible to reduce the equipment cost for the rotating mechanisms remarkably, in comparison with the equipment cost of an apparatus having an exclusive rotating mechanism for the top plate 62. Further, the particles produced from the motor can be decreased. Owing to the provision of no motor to rotate the top plate 62 on the outer chamber 46 (e.g. an upper face of the ceiling part 46*a*), it is possible to decrease a space that the upper part of the substrate cleaning unit 12 occupies. That is, the height of the unit 12 can be reduced for its miniaturization. Additionally, since no rotating mechanism is arranged above the wafer W, it is possible to restrain the influence of the particles on the wafer W.

Arranged above the chuck plate 61 is an under plate 100 which can approach the wafer W from its underside to cover the lower surface of the wafer W. Inside the rotary cylinder 96, an under-plate shaft 101 supporting the under plate 100 is arranged to penetrate an inner cavity of the rotary cylinder 96. As shown in FIG. 4, the under-plate shaft 101 is secured on the upper face of a horizontal plate 104. By an "under-plate" elevating mechanism 105, such as air cylinder, the horizontal plate 104 is vertically moved up and down in a body with the under-plate shaft 101. Accordingly, as shown in FIG. 4, the under plate 100 can be lowered into a condition of standing ready apart from the lower surface of the wafer W held by the holding members 60 (withdrawal position). The under plate 100 can be also elevated into a condition of processing the lower surface of the wafer W held by the holding members 60 (processing position).

Next, we describe various supply means of the processing fluids etc. in the substrate cleaning unit 12. The outer chamber 46 is provided, on its upper part, with a processing-fluid nozzle 110 for supply the wafer W with various processing fluids, such as processing liquids (e.g. chemical liquids, deigned water (DIW) and inert gas (e.g. $N_2$-gas). The outer chamber 46 further includes an $N_2$-gas nozzle 111 for supplying the wafer W with $N_2$-gas for dry and a purge-gas nozzle 112 for supplying the inert gas (e.g. $N_2$-gas, air) to the upper part of the top plate 62.

The processing-fluid nozzle 110 is slanted to the top plate 62, allowing the processing fluids to be ejected toward the supply hole 70 obliquely. For instance, when supplying the wafer W with the processing liquids (e.g. chemical liquid, deigned water, etc.), the processing-fluid nozzle 110 expels the processing liquid toward the supply hole 70 to supply the processing liquid to the vicinity of the center of the upper surface of the wafer W. The processing-fluid nozzle 110 is arranged so that its lowermost point deviates from the "straight" upside of the supply hole 70. Namely, in plan view, the lowermost point of the nozzle 110 is not included in a projected area of the supply hole 70. In the shown example, the lowermost point is positioned over the tapered portion 71. With the arrangement, even if the residual processing liquid in the nozzle 110 drops from its tip while stopping the supply of the processing liquid, there is no possibility that the processing liquid falls through the supply hole 70 and adheres to the upper surface of the wafer W since the tapered portion 71 receives the processing liquid falling off the nozzle 110. Then, the processing liquid falling onto the top plate 62 flows toward the periphery of the plate 62 due to its rotation. Finally, the processing liquid is transferred to the circumference of the plate 62.

Owing to the provision of a switching valve 115, any one of chemical liquid, deigned water and $N_2$-gas can be designated as the processing fluid to be supplied from the processing-fluid nozzle 110. For example, after supplying the processing liquid (chemical liquid, deionized water, etc.) to the wafer W through the nozzle 110, it may be carried out to switch the position of the valve 115 thereby supplying the inside of the nozzle 110 with a drainage gas, such as $N_2$-gas. Consequently, the residual processing liquid remaining between the valve 115 and the tip of the nozzle 110 can be discharged by the drainage gas. Then, in order to prevent the residual processing liquid from falling into the supply hole 70, the flow rate of $N_2$-gas is controlled so that the processing liquid falls off the tip of the nozzle 110 onto the tapered portion 71 of the top plate 62.

The $N_2$-gas nozzle 111 expels $N_2$-gas for dry against the supply hole 70 downward. For example, in case of drying the wafer W, $N_2$-gas for dry is ejected through the $N_2$-gas nozzle 111. Passing through the supply hole 70, the $N_2$-gas for dry is supplied toward the center of the upper surface of the wafer W. Then, the so-supplied $N_2$-gas flows between the top plate 62 and the upper surface of the wafer, toward the circumference of the wafer W.

The purge-gas nozzle 112 expels an inert gas (e.g. $N_2$-gas) and gas (e.g. air) from the upside of the outer chamber 46 onto the upper part of the top plate 62 to form downflow of gas in the outer chamber 46. Further, since the space between the upper surface of the top plate 62 and the outer chamber 46 is filled up with gas (inert gas, air, etc.), it is possible to prevent a vapor of the processing liquid from entering the upside of the top plate 62 through its periphery. Thus, it is possible to prevent the atmosphere of the processing liquid from remaining in the upper part of the outer chamber 46. When processing a hydrophobic wafer W, the purge-gas nozzle 112 supplies $N_2$-gas as the downflow (purge) gas. Then, it is possible to produce an effect to prevent an occurrence of water-marks on the surface of the hydrophobic wafer W. While, when processing a hydrophilic wafer W, the nozzle 112 may supply air in view of reducing the cost of the downflow (purge) gas.

The under plate 100 is equipped with a "lower-surface" passage 118 to supply a processing fluid (e.g. chemical liquids, deionized water, $N_2$-gas, etc.) to the wafer W. The "lower-surface" passage 118 penetrates the under-plate shaft 101 and the under plate 100. On the upper surface of the under plate 100, "lower-surface" vomiters are formed to eject the processing fluid (chemical liquids, deionized water, $N_2$-gas, etc.) fed through the passage 118. Note, one "lower-surface" vomitory at the center of the under plate 100 orientates the center of the wafer W upward, while four "lower-surface" vomitories around the above "lower-surface" vomitory are inclined toward the periphery of the wafer W, allowing the processing fluid to be swept away toward the periphery of the wafer W effectively.

Below the under plate 100, an $N_2$-gas passage 120 is formed to supply a gap between the chuck plate 61 and the under plate 100 with $N_2$-gas as the inert gas. The $N_2$-gas passage 120 penetrates the under-plate shaft 101. The space defined between the upper surface of the chuck plate 61 and the lower surface of the under plate 100 is filled up with $N_2$-gas for purge. In rotating the wafer W, the supply of $N_2$-gas prevents an atmosphere between the chuck plate 61 and the under plate 100 from producing a negative pressure. Thus, it is possible to prevent particles originating in the rotation of the motor 95 from passing through the cavity in the rotary cylinder 96 and invading the space between the chuck plate 61 and the under plate 100. In addition, the $N_2$-gas passage 120 supplies $N_2$-gas into the cavity in the rotary cylinder 96. Thus, the space defined between the rotary cylinder 96 and the under-plate shaft 101 is also filled up with $N_2$-gas for purge. Also in this case, it is possible to prevent particles originating in the rotation of the motor 95 from passing through the cavity in the rotary cylinder 96 and invading the space between the chuck plate 61 and the under plate 100.

Figure 8:
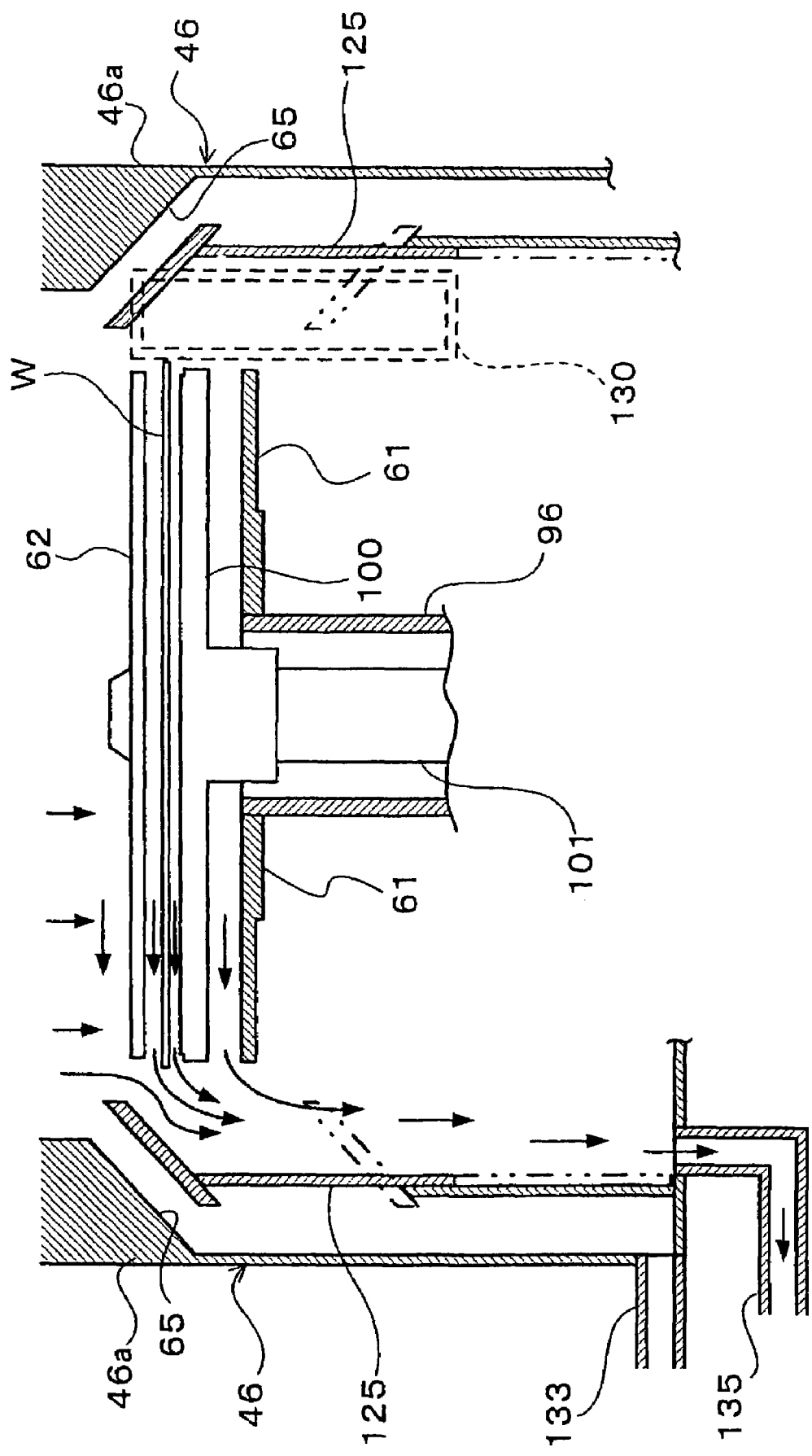
FIG. 8 is an explanatory view explaining the rise and fall of the inner cup and the flows of waste fluid or emission.

As shown in FIGS. 4 and 8, the outer chamber 46 contains an inner cup 125 to surround the wafer W. Further, the outer chamber 46 is equipped with "outer-chamber" exhaust ports 130 each opening at the same level as the rotating wafer W, an "outer-chamber" drain pipe 133 for draining droplets in the outer chamber 46 and an "inner-cup" drain pipe 135 for draining droplets in the inner cup 135.

The inner cup 125 is movable between its lowered position and the elevated position. In the lowered position of the inner cup 125, there is established a condition where the holding members 60 project above the upper end of the outer chamber 46 to deliver the wafer W. While, in the elevated position of the inner cup 125, there is established a condition where the cup 125 surrounds the wafer W to prevent the processing liquid etc. supplied on both sides of the wafer W from spattering in the circumference.

Each of the "outer-chamber" exhaust ports 130 is formed in the sidewall 46a of the outer chamber 46 to discharge various atmospheres therefrom smoothly. As for the atmospheres, there are "processing-liquid" atmosphere flowing toward the periphery of the wafer W due to the rotation of the wafer W, the chuck plate 61 and the top plate 62; $N_2$-gas for dry; downflow gas for purge; and $N_2$-gas for purge from the $N_2$-gas passage, etc. The"outer-chamber" drain pipe 133 is connected, at the lower part of the outer chamber 46, with a space between the outer chamber 46 and the inner cup 125 to discharge the processing liquid from the bottom part of the chamber 46 between the sidewall 46a and the outer wall of the cup 125. At the lower part of the outer chamber 46, the "inner-cup" drain pipe 135 is connected with the inside of the inner cup 125 to discharge the processing liquid therefrom. Note, the above "outer-chamber" exhaust ports 130 open at two positions in the circumference of the wafer W.

As shown in FIG. 8, when the inner cup 125 rises, it surrounds the wafer W to establish a condition to prevent the processing liquid etc. on both sides of the wafer W from scattering around. Then, the up per part of the inner cup 125 approaches the inclined part 65, so that droplets in the inner cup 125 are discharged by the "inner-cup" drain pipe 135. The atmosphere consisting of the downflow (purge) gas, $N_2$-gas for purge and the like flows inside the inner cup 125 downward and is discharged through the "inner-cup" drain pipe 135, as well. When the inner cup 125 falls, there is established a state where the so-held wafer W projects from the upper end of the inner cup 125 upward, as shown in FIG. 4. Then, the droplets in the outer chamber 46 drop on the exterior side of the inner cup 125 and are discharged by the "outer-chamber" drain pipe 133. The atmospheres of the $N_2$-gas for dry, the downflow gas for purge, the $N_2$-gas for purge, etc. are blown away to the sidewall 46a of the outer chamber 46 and successively discharged from the outer chamber 46 through the "outer-chamber" exhaust port 130.

In the cleaning system 1, the other substrate cleaning units 13, 14, 15 are similar to the above-mentioned substrate cleaning unit 12 in terms of its constitution. Equally, any substrate cleaning unit 13 (14, 15) is capable of cleaning both sides of the wafer W by the chemical liquid, simultaneously.

Now, in the cleaning system 1, a not-shown transfer robot first lays the carriers C each accommodating the wafers W, for example, twenty-five wafers Won the in/out port 4. Next, the pickup/accommodating arm 11 takes the wafers W out of the carrier C mounted on the in/out port 4 one by one and successively delivers the wafer W to the main wafer transfer unit 18. For example, the transfer arm 34 appropriately transfers the wafer W to the substrate processing unit 12 (13, 14, 15) where the contaminants, such as particles, are removed from the wafers W. In this way, the wafer W after completing the designated cleaning process is suitably discharged from the substrate processing unit 12 (13, 14, 15) by the main wafer transfer unit 18. Subsequently, the wafer W is delivered to the pickup/accommodating arm 11 one by one and successively accommodated in the carrier C again.

We now describe the cleaning operation at the substrate processing unit 12 representatively. As shown in FIG. 4, the "outer-chamber" mechanical shutter 53 of the substrate processing unit 12 opens at first. Then, the transfer arm 34 carrying the wafer W enters the unit. At this time, the inner cup 125 is lowered to make the upper potions of the holding members 60 project upward relatively. While, the under plate 100 is lowered in advance, at the withdrawal position. The top plate 62 is elevated in advance, at the withdrawal position. That is, the chuck plate 61 transfers the "top-plate" supporting member 75 to a position that allows it to be pushed up by the "top-plate" elevating mechanism 90. Subsequently, as the push-up member 91 of the mechanism 90 raises the "top-plate" supporting member(s) 75, the top plate 61 is maintained in its raised position.

The main wafer transfer unit 18 moves the transfer arm 34 horizontally to deliver the wafer W to the support pins 69. The support pins 69 carry the wafer W in a manner that its surface for semiconductor device orientates upward. Then, as the under plate 100 is in the withdrawal position far from the height (level) of the wafer W to be carried, the transfer arm 34 can deliver the wafer W to the support pins 69 easily. After delivering the wafer W to the support pins 69, the transfer arm 34 withdraws from the interior of the outer chamber 46 and thereafter, the "outer-chamber" mechanical shutter 53 is closed.

Next, the holding members 60 hold the periphery of the wafer W supported on the support pins 69. On the other hand, the inner cup 125 rises to surround the wafer W. The top plate 62 is lowered to the processing position close to the wafer W. That is, when the push-up member 91 of the "top-plate" elevating mechanism 90 is lowered to a position to make no contact with the "top-plate" supporting member 75, each of the parallel supporting members 77 abuts on the upper surfaces of the stoppers 84, so that the top plate 62 is supported by the chuck plate 61 through the "top-plate" supporting members 75. Then, there is produced a gap of the order of e.g. 1 mm, between the top plate 62 in the processing position and the upper surface of the wafer W. The under plate 100 rises to the processing position. A gap of the order of e.g. 1 mm is produced between the under plate 100 in the processing position and the lower surface (back side) of the wafer W.

Next, the motor 95 rotates the rotary cylinder 96. Consequently, the holding members 60, the wafer W held by the holding members 60 and the top plate 62 rotate integrally. In this state, a chemical liquid is supplied to the wafer W through the processing-fluid nozzle 110 and the "lower-surface" passage 118, performing a chemical processing on the wafer W.

As shown in FIG. 5, the processing-fluid nozzle 110 expels the chemical liquid to the vicinity of the center of the wafer W obliquely. Then, the chemical liquid supplied to the wafer W through the supply hole 70 flows toward the periphery of the wafer W due to a centrifugal force of the rotating wafer W. Since respective narrow gaps are defined between the top plate 62 and the wafer W (upper surface) and between the under plate 100 and the wafer W (lower surface), it is possible to allow only the chemical liquid to lie therebetween. Therefore, the wafer W can be cleaned with a small quantity of chemical liquid. As shown in FIG. 8, the chemical liquid reaching the periphery of the wafer W is drained into the inner cup 125 and subsequently discharged from the cup 125 through the "inner-cup" drain pipe 135.

During the chemical processing, the purge-gas nozzle 112 supplies the downflow (purge) gas onto the top plate 62, thereby forming the downflow. When the wafer W is hydrophobic, it may be supplied with inert gas, for example, $N_2$-gas as the down flow gas. Alternatively, when the wafer W is hydrophilic, it may be supplied with air. The downflow gas supplied from the nozzle 112 flows from the periphery of the top plate 62 to the inner cup 125 through the periphery of the wafer W and is discharged from the inner cup 125 by the "inner-cup" drain pipe 135, as shown in FIG. 8. During the chemical processing, it is also performed to supply "purge" $N_2$-gas (as the inert gas) from the $N_2$-gas passage 120 into the space between the chuck plate 61 and the under plate 100 and also the cavity in the rotary cylinder 96. The "purge" $N_2$-gas from the $N_2$-gas passage 120 flows between the chuck plate 61 and the under plate 100, toward the periphery of the wafer W and into the inner cup 125, as shown in FIG. 8. Next, the "purge" $N_2$-gas is discharged from the inner cup 125 through the "inner-cup" drain pipe 135.

After completing the chemical processing on both sides of the wafer W, it is carried out to stop the ejection of the chemical liquid through the processing-liquid nozzle 110 by the switching valve 115. Additionally, the ejection of the chemical liquid from the "lower-surface" passage 118 is also stopped. The supply of the "purge" $N_2$-gas through the $N_2$-gas passage 120 is maintained to prevent an atmosphere between the chuck plate 61 and the under plate 100 from producing a negative pressure. Further, the supply of downflow (purge) gas from the nozzle 112 is also maintained to form the downflow to discharge chemical atmosphere. The rotations of the holding members 60, the wafer W held by the members 60, the top plate 62 and the chuck plate 61 are maintained respectively. Thus, the chemical liquid is thrown off the wafer W, the top plate 62, the chuck plate 61 and the under plate 100, and successively discharged into the inner cup 125. Noted that, when throwing off the chemical liquid after the chemical processing, it may be carried out to supply inert gas (e.g. $N_2$-gas), IPA or the like through the intermediary of the processing-liquid nozzle 110 and the "lower-surface" passage 118 in order to sweep away the chemical liquid.

After the chemical processing, even if the residual chemical liquid in the nozzle 110 drops from its tip, the so-dropped chemical liquid does not adhere to the upper surface of the wafer W since the tapered part 71 about the supply hole 70 receives the chemical droplets. Additionally, after the chemical processing and before rinsing the wafer W, it may be performed to change the position of the switching valve 115 and supply the nozzle 110 with $N_2$-gas in order to remove the chemical liquid existing between the valve 115 and the nozzle's tip from the nozzle 110. In this case, the flow rate of $N_2$-gas is controlled so that the tapered part 71 can receive the chemical droplets falling from the nozzle's tip, steadily. Then, the chemical droplets on the rotating top plate 62 are urged toward the periphery of the top plate 61 due to centrifugal force and successively drained into the inner cup 125.

Alternatively, the residual chemical liquid between the switching valve 115 and the nozzle tip may be removed from the nozzle 110 by the chemical's own weight automatically.

After sufficiently throwing off the chemical liquid from the holding members 60, the wafer W, the top plate 62 and the chuck plate 61 into the inner cup 125, the inner cup 125 is lowered. Thereafter, by actuating the switching valve 115, it is carried out to quit ejecting the chemical liquid through the nozzle 110 and start ejecting the deionized water through the nozzle 110 and the "lower-surface" passage 118, instead. In this way, it is started to rinse both sides of the wafer W. At the rinsing process, the holding members 60, the wafer W held by the members 60, the top plate 62 and the chuck plate 61 are rotated at high speed in comparison with the rotating speed at the chemical processing.

Noted that the processing-fluid nozzle 110 expels the deionized water toward the vicinity of the wafer's center obliquely. Then, the deionized water supplied to the vicinity of the wafer's center through the supply hole 70 flows toward the periphery of the wafer W due to the centrifugal force of the rotating wafer W. Since respective narrow gaps are defined between the top plate 62 and the wafer W (upper surface) and between the under plate 100 and the wafer W (lower surface), it is possible to allow only the deionized water to lie therebetween. Therefore, the wafer W can be cleaned with a small quantity of deionized water. The deionized water reaching the periphery of the wafer W is drained into the outer chamber 46 and flows outside the inner cup 125. Then, the deionized water is discharged from the outer chamber 46 through the "outer-chamber" drain pipe 133.

During the rinsing process as well, the purge-gas nozzle 112 supplies the downflow (purge) gas onto the top plate 62 to form the downflow thereby preventing an atmosphere of steam from entering the upper portion of the outer chamber 46. Since the top plate 62 rotates at high speed during the rinsing process, the downflow (purge) gas from the nozzle 112 flows at high speed in comparison with that of the same gas during the chemical processing. The downflow (purge) gas on the periphery of the wafer W flows toward the sidewall 46a of the outer chamber 46 and is discharged through the "outer-chamber" exhaust port 130.

Since the chuck plate 61 also rotates at high speed during the rinsing process, there is a tendency for the atmosphere between the chuck plate 61 and the under plate 100 to have a more negative pressure than that at the chemical processing. Therefore, the "purge" $N_2$-gas is increased in its amount supplied through the $N_2$-gas passage 120, in comparison with the amount of the "purge" $N_2$-gas at the chemical processing. Accordingly, comparing with the chemical processing, the "purge" $N_2$-gas is also increased in its flow rate flowing toward the periphery of the wafer W and blown against the sidewall 46a of the outer chamber 46. Since the "outer-chamber" exhaust port 130 serves to discharge the atmosphere flowing against the periphery of the wafer W through the sidewall 46a of the outer chamber 46, it is possible to increase the "purge" $N_2$-gas in amount supplied through the $N_2$-gas passage 120.

On completion of the rinsing process on both sides of the wafer W, the discharge of deionized water through the nozzle 110 is stop pad by actuating the switching valve 115. Further, the discharge of deionized water through the "lower-surface" passage 118 is stopped as well. It is maintained to supply the "purge" $N_2$-gas through the $N_2$-gas passage 120, preventing an atmosphere between the chuck plate 61 and the under plate 100 from having a negative pressure. The supply of the downflow (purge) gas from the nozzle 112 is maintained to form the downflow to discharge the atmosphere of steam. The rotations of the holding members 60, the wafer W, the top plate 62 and the chuck plate 61 are maintained. Successively, the "dry" $N_2$-gas is supplied through the $N_2$-gas nozzle 111 and also the lower-surface passage 118, performing the drying process of the wafer W.

In the drying process, the $N_2$-gas nozzle 111 expels the "dry" $N_2$-gas toward the vicinity of the wafer's center downward. Then, the "dry" $N_2$-gas supplied to the vicinity of the wafer's center through the supply hole 70 flows toward the periphery of the wafer W due to the centrifugal force of the rotating wafer W. Since respective narrow gaps are defined between the top plate 62 and the wafer W (upper surface) and between the under plate 100 and the wafer W (lower surface), it is possible to allow only the "dry" $N_2$-gas to lie therebetween. Therefore, the wafer W can be processed with a small quantity of $N_2$-gas. The $N_2$-gas reaching the periphery of the wafer W is drained into the outer chamber 46 and flows outside the inner cup 125. Then, the $N_2$-gas is discharged from the outer chamber 46 through the "outer-chamber" drain pipe 133. Additionally, the "dry" $N_2$-gas flowing toward the sidewall 46a of the outer chamber 46 through the periphery of the wafer W is discharged from the "outer-chamber" exhaust port 130.

During the drying process as well, the purge-gas nozzle 112 supplies the downflow (purge) gas onto the top plate 62 to form the downflow in the chamber 46. Further, the "purge" $N_2$-gas is supplied from the $N_2$-gas passage 120 to the gap between the chuck plate 61 and the under plate 100. Both of the downflow (purge) gas from the upside of the top plate 62 to the periphery of the wafer W and the "purge" $N_2$-gas from the gap between the chuck plate 61 and the under plate 100 to the periphery of the wafer W flow through the outside of the inner cup 125 and are discharged from the interior of the outer chamber 46 through the "outer-chamber" drain pipe 133. Further, both of the downflow (purge) gas and the "purge" $N_2$-gas that flow toward the sidewall 46a of the outer chamber 46 through the periphery of the wafer W are discharged from the "outer-chamber" exhaust port 130.

During the drying process, even if the residual deionized water drops from the nozzle 110 at a standstill of ejecting the processing liquid, the so-dropped deionized water does not adhere to the upper surface of the wafer W since the tapered part 71 about the supply hole 70 receives the water droplets. Additionally, after completing the rinsing process, it may be performed to change the position of the switching valve 115 and supply the nozzle 110 with $N_2$-gas in order to remove the deionized water existing between the valve 115 and the nozzle's tip from the nozzle 110. In this case, the flow rate of $N_2$-gas is controlled so that the tapered part 71 can receive the water droplets falling from the nozzle's tip, steadily. Then, the water droplets on the rotating top plate 62 are urged toward the periphery of the top plate 61 due to centrifugal force and successively drained into the outer chamber 46. Alternatively, the residual deionized water between the switching valve 115 and the nozzle's tip may be removed from the nozzle 110 by the water's own weight automatically.

After completing the drying process, the discharge of "dry" $N_2$-gas through the $N_2$-gas nozzle 111 is stopped. Further, the discharge of "dry" $N_2$-gas through the "lower-surface" passage 118 is stopped as well. Then, the under plate 100 is lowered to the withdrawal position, while the top plate 62 is elevated to the withdrawal position. That is, the chuck plate 61 allows the "top-plate" supporting members 75 to move to the positions where they can be pushed up by the "top-plate" elevating mechanism 90 and further stop. Thereafter, since the "top-plate" elevating mechanism 90 raises the "top-plate" supporting members 75 through the push-up member 91, the parallel supporting members 77 rise up to the upper parts of the guide pins 83, maintaining a condition to elevate the top plate 62. Subsequently, the wafer W is unloaded out of the substrate cleaning unit 12. The "outer-chamber" mechanical shutter 53 opens and the wafer transfer unit 18 makes the transfer arm 34 enter into the unit 12 to support the lower surface of the wafer W. On the other hand, it is carried out to release the wafer W from the holding members 60 and further support the lower surface of the wafer W by the support pins 69. Next, the transfer arm 34 receives the wafer W from the support pins 69 and continuously withdraws from the unit 12. During this process, since the top plate 62 and the under plate 100 have already moved to their withdrawal positions, there is produced a sufficient clearance between the under plate 100 and the wafer W held by the support pins 69. Therefore, the transfer arm 34 can receive from the support pins 69 with composure.

According to the substrate cleaning unit 12, since the wafer W and the top plate 62 are rotated in a body by the motor 95, there is no need to provide an exclusive rotating mechanism for the top plate 62. Accordingly, the particles produced from the rotating mechanisms can be reduced in comparison with the conventional substrate processing apparatus. Further, the substrate processing apparatus can be small-sized, whereby it is possible to reduce the installation cost for the rotating mechanisms remarkably. Further, since no elevating mechanism (e.g. rotating mechanism, cylinder) is arranged above the held wafer W, it is possible to restrain the influence of particles on the wafer W. Additionally, it is possible to narrow and stabilize gap between the top plate 62 and the wafer W, accomplishing an effective processing. Further, it is possible to discharge the chemical liquid that has been left in the processing-fluid nozzle 110 since the chemical processing, from the nozzle 110 without falling onto the wafer W.

The present invention is applicable to not only the above-mentioned substrate cleaning apparatus to which the processing liquids are supplied, but also a substrate processing apparatus for the other treatments for the substrate except cleaning the substrate. Additionally, a substrate as the object to be processed is not limited to a semiconductor wafer only. Thus, the semiconductor may be replaced with the other substrate, for example, substrate for LCD glass, CD substrate, print base plate, ceramic substrate, etc.

The holding members 60 may be constructed so as to hold the wafer W by making use of centrifugal force of the rotating chuck plate. In this case, it is possible to reduce the number of particles because of no need to provide the release mechanism 67.

Figure 9:
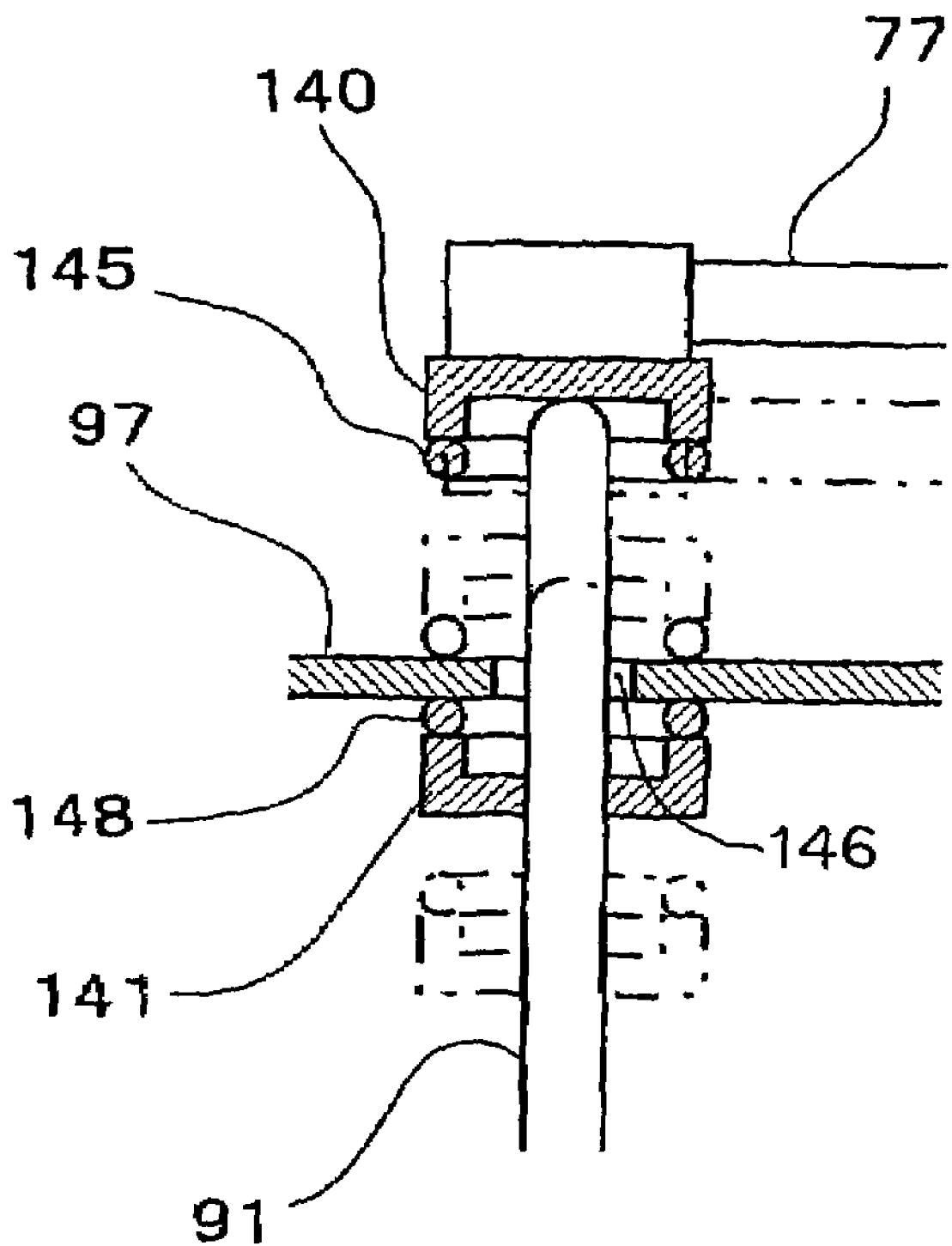
FIG. 9 is a view explaining a forcing member in accordance with another embodiment of the present invention.

As shown in FIG. 9, the push-up member 91 may be provided, on its portion penetrating the "driving-mechanism" chamber 97, with an upper cap 140 and a lower cap 141. The upper cap 140 is secured to the push-up member (part) 91 projecting from the chamber 97 while surrounding the periphery of the member 91. The upper cap 140 is provided, on a lower part thereof, with an annular contact member 145. A through-hole 146 for the push-up member 91 is formed in the chamber 97. When the push-up member 91 is lowered, the upper cap 140 adheres closely to the upper surface of the chamber 97 through the contact member 145 while surrounding both upside and periphery of the through-hole 146. Thus, when the push-up member 91 is lowered, the atmosphere in the chamber 97 does not leak out through the through-hole 146, whereby it becomes possible to prevent the particles from invading the circumference of the wafer W. Further, since the atmosphere of the processing liquid, the dry gas, the downflow (purge) gas, the "purge" $N_2$-gas, etc. do not enter the chamber 97, there is no possibility that the "top-plate" elevating mechanism 90, the motor 95 and there lease mechanism 67 are contaminated by the atmosphere of the processing liquid. On the other hand, the lower cap 141 is fixed to the push-up member (part) 91 as if the cap 141 were surrounding the periphery of the member 91. The lower cap 141 is provided, on an upper part thereof, with an annular contact member 148. When the push-up member 91 is elevated, the lower cap 141 adheres closely to the lower surface of the chamber 97 through the contact member 148n while surrounding both underside and periphery of the through-hole 146. Thus, when the push-up member 91 is elevated, the atmosphere in the chamber 97 does not leak out through the through-hole 146, whereby it becomes possible to prevent the particles from invading the circumference of the wafer W. Further, since the atmosphere of the processing liquid, the dry gas, the downflow (purge) gas, the "purge" $N_2$-gas, etc. do not enter the chamber 97, there is no possibility that the "top-plate" elevating mechanism 90, the motor 95 and the release mechanism 67 are contaminated by the atmosphere of the processing liquid. In the modification, the chemical processing on the wafer W may be accomplished by a chemical membrane formed between the top plate 62 and the upper surface of the wafer W. In this case, for example, it is carried out to make the top plate 62 approach the upper surface of the wafer W held by the holding members 60 to define a gap of the order of 0.5 to 3 mm between the top plate 62 and the wafer W. Next, the processing-fluid nozzle 110 supplies a chemical liquid to the vicinity of the wafer's center. Then, the chemical liquid is urged toward the periphery of the wafer W due to its centrifugal force, thereby spreading all over the gap. On the completion of forming the chemical membrane in the whole gap, the supply of the chemical liquid via the nozzle 110 is stopped to perform the chemical processing on the upper surface of the wafer W by the chemical membrane. During the chemical processing, the wafer W and the top plate 62 are rotated at a relatively-slow speed (e.g. the order of 10-30 r.p.m.) so as not to collapse the shape of the chemical membrane. Due to the rotation of the wafer W, there is produced a liquid current in the chemical membrane, whereby it is possible to prevent stagnation in the chemical membrane and also possible to improve the processing efficiency. Only when the chemical membrane is likely to be collapsed in shape, new chemical liquid is supplied to restore the chemical membrane to its former condition. After the formation of the complete chemical membrane, the supply of new chemical liquid is stopped. In this way, the consumption of the chemical liquid can be saved. Similarly, the above-mentioned chemical processing employing the chemical membrane is applicable to the chemical processing for the lower surface of the wafer W. Then, a chemical membrane is formed between the under plate 100 and the power surface of the wafer W.

Next, we describe the substrate cleaning unit in accordance with the second embodiment of the invention.

Figure 10:
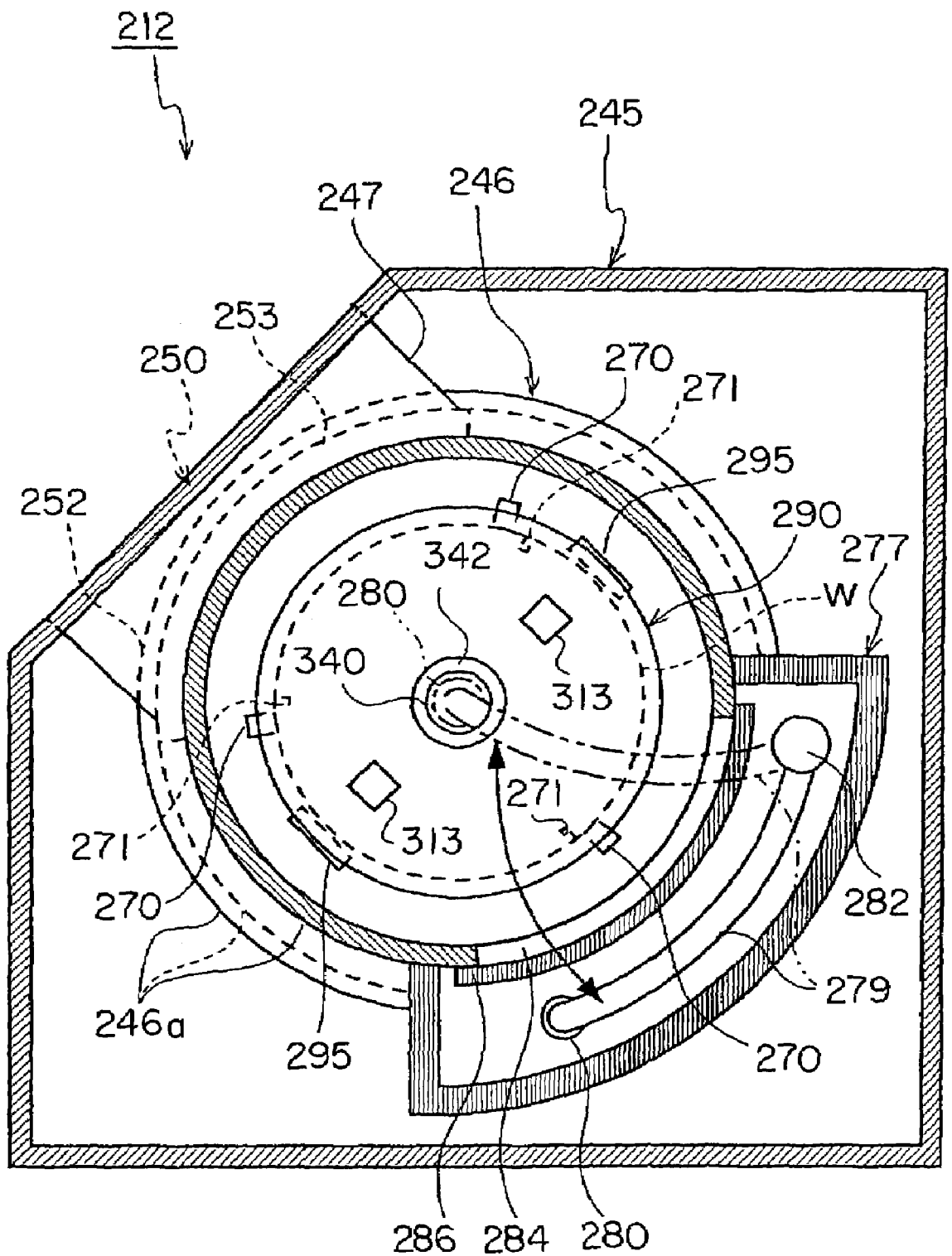
FIG. 10 is a plan view of the substrate processing apparatus in accordance with the second embodiment of the present invention.
Figure 11:
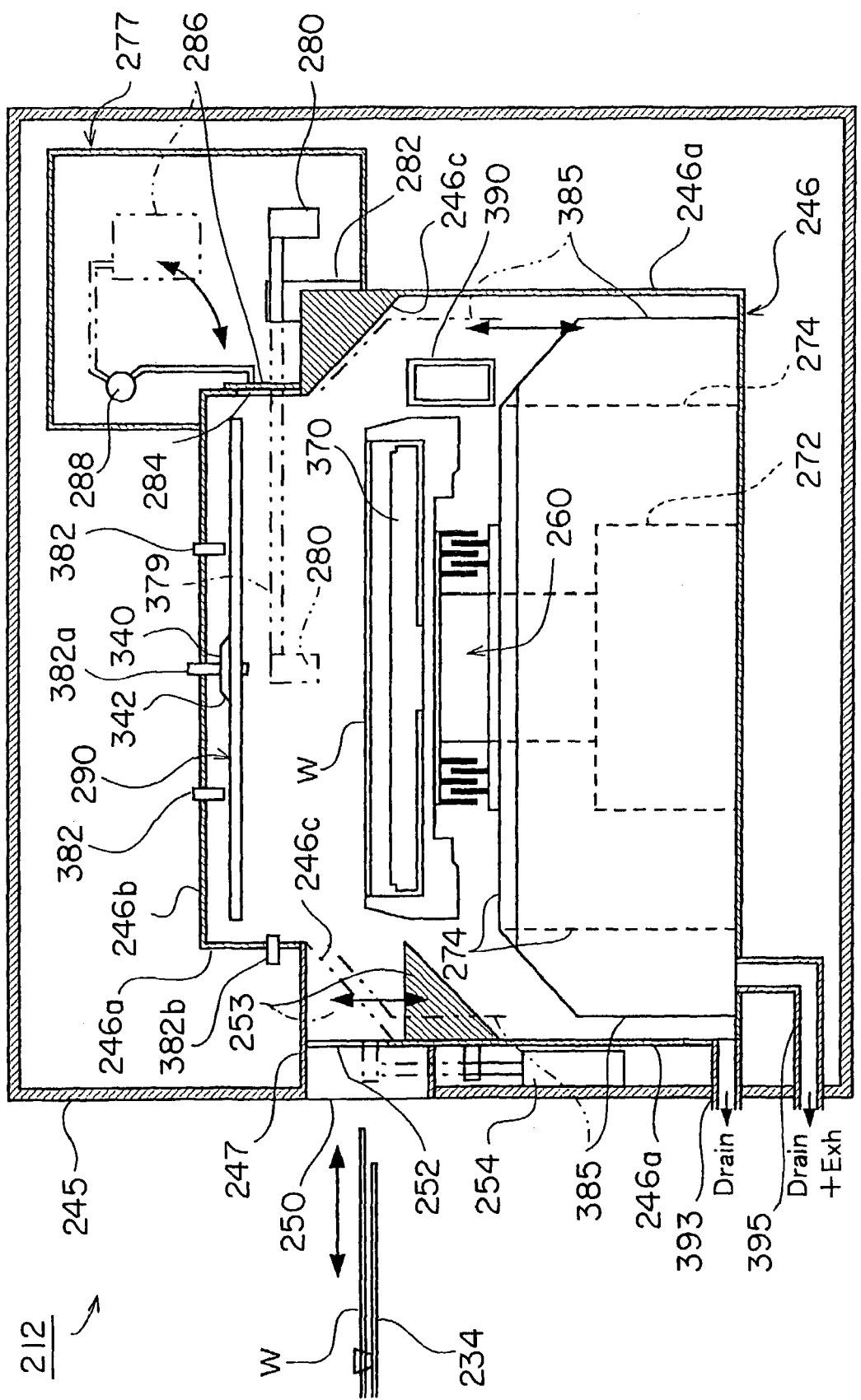
FIG. 11 is a longitudinal sectional view of the substrate processing apparatus of FIG. 10.

FIG. 10 is a plan view of a substrate cleaning unit 212 in accordance with the second embodiment. FIG. 11 is a longitudinal sectional view of the substrate cleaning unit 212. A unit chamber 245 of the substrate cleaning unit 212 includes an outer chamber 246 that accommodates the wafer W and process it with a processing fluid. The unit chamber 45 has an opening 250 formed therein, while the outer chamber 246 has an opening 252 formed in its sidewall 246a. The opening 252 is communicated with the opening 50 through an opening 247. The outer chamber 245 is provided with a mechanical shutter 253 that is driven by a cylinder driving mechanism 254 consisting of an air cylinder etc. to move up and down thereby opening and closing the opening 252. For example, when the transfer arm 234 transfers the wafer W into or from the outer chamber 246 through the opening 247, the mechanical shutter 253 opens. This mechanical shutter 253 is constructed so as to open and close the opening 252 on the interior side of the outer chamber 246. Therefore, even if a positive pressure is formed in the outer chamber 246, there is no possibility that an atmosphere inside the outer chamber 246 leaks out.

In the outer chamber 246, as shown in FIG. 11, there is a spin chuck 260 for holding the wafer W substantially horizontally. The periphery of the wafer W is held by the spin chuck 260 while the wafer's processing surface for a semiconductor device orientates upward.

Figure 12:
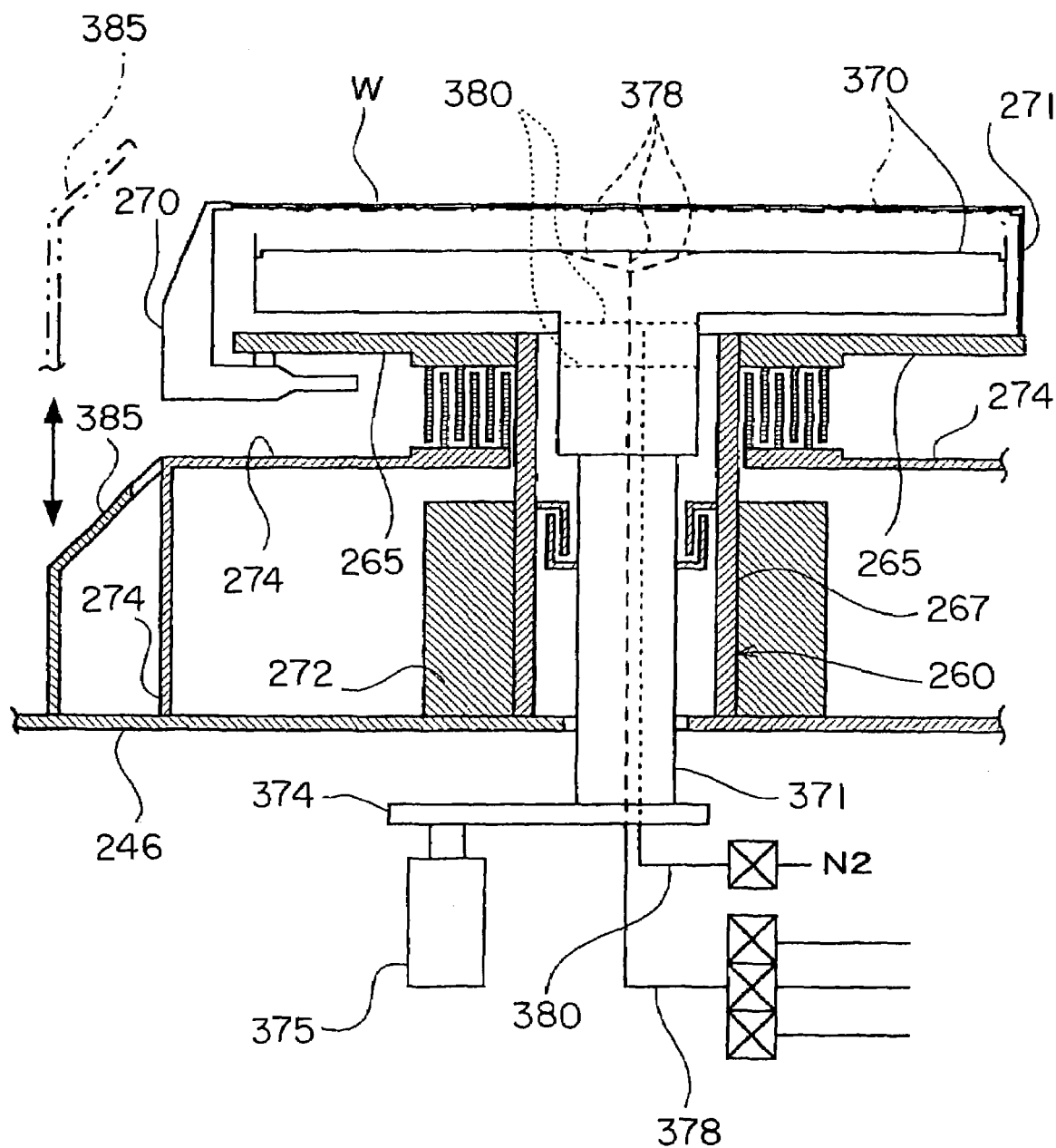
FIG. 12 is a longitudinal sectional view of the substrate processing apparatus, explaining the constitution in the vicinity of a spin chuck.

As shown in FIG. 12, the spin chuck 260 comprises a chuck plate 265, a rotary cylinder 267 connected with the bottom of the chuck plate 265 and three holding members 270 for contact with the periphery of the wafer W. A motor 272 connected with the lower part of the rotary cylinder 267 rotates the whole spin chuck 260 by rotating the rotary cylinder 267. Being held by the spin chuck 260, the wafer W rotates in the horizontal plane, in a body with the spin chuck 260.

Figure 13A:
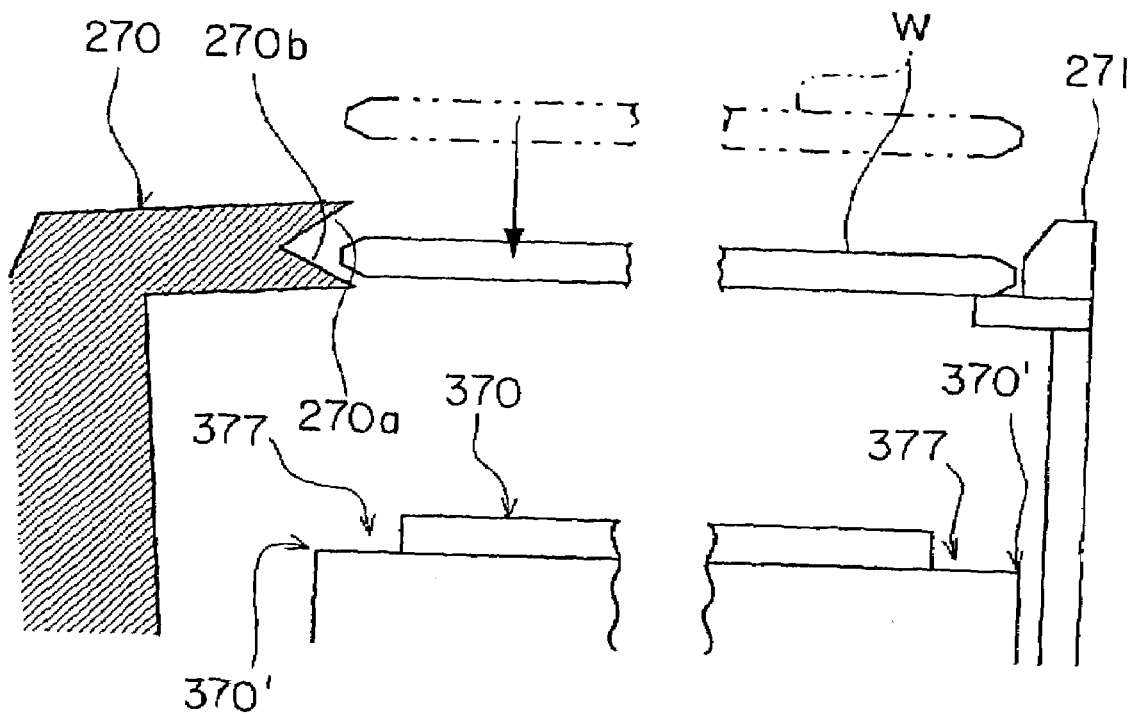
FIGS. 13A and 13B are explanatory views explaining respective movements of a holding member and a supporting pin.
Figure 13B:
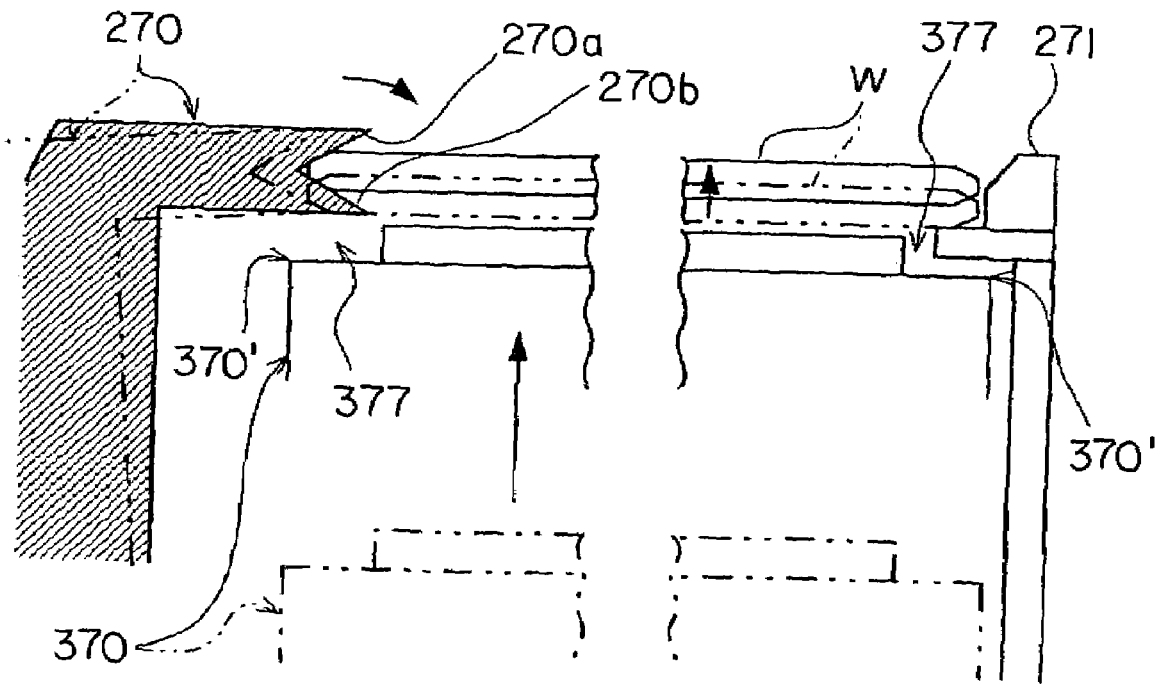

As shown in FIG. 10, the holding members 270 are arranged about the wafer's center at intervals of 120 degrees in the circumference of the chuck plate 265. Thus, the periphery of the wafer W can be held by the holding members 260 through respective inner faces thereof. The chuck plate 265 is provided with three support pins 271 for supporting the wafer W at a height of the wafer W held by the members 260. As shown in FIG. 10, three support pins 271 are arranged so as to abut on the back side of the wafer W, at intervals of 120 degrees in the circumference direction of the wafer W. As shown in FIGS. 13A and 13B, each holding member 270 is provided, on an inner face thereof, with an upper slant face 270a and a lower slant face 270b both of which are inclined so as to separate from each other toward the wafer's center. In holding the wafer W through three holding members 270, the periphery of the wafer W is pinched between the upper slant face 270a and the lower slant face 270b about each holding member 270. With this arrangement, it is possible to hold the periphery of the wafer W up and down, surely.

When loading the wafer W into the substrate cleaning unit 212, as shown in FIG. 13A, it is firstly carried out to support the periphery (back side) of the wafer w by the support pins 271. At this time, respective upper parts of three holding members 270 are separated from each other out wardly, standing ready in positions where they do not interfere with the wafer W transferred from the transfer arm 234 to the support pins 271. After supporting the wafer W by the support pins 271, as shown in FIG. 13B, the holding members 270 are moved inward to pinch the periphery of the wafer W between the upper slant face 270a and the lower slant face 270b each. Then, the wafer W is lifted from the support pins 271. When discharging the wafer W from the substrate cleaning unit 212, it is firstly carried out to move the holding members 270 outward thereby releasing the wafer W from the members 270. Consequently, the wafer W comes into a condition to be mounted on the support pins 271. Then, the wafer W supported by the support pins 271 is transferred to the transfer arm 234.

The motor 272 is disposed in a "driving mechanism" chamber 274 formed below the wafer W held by the spin chuck 260. The "driving mechanism" chamber 274 surrounds the circumference of the motor 272 and its upside to prevent particles produced from the motor 272 from invading the wafer W. The outer chamber 246 is adapted so as to surround both upside and circumference of the wafer W held by the spin chuck 260. The outer chamber 246 includes an annular sidewall 246a surrounding the circumference of the wafer W and a ceiling part 246b covering the upside of the wafer W and also seals up an atmosphere about and above the wafer W to seclude this atmosphere from an atmosphere outside the outer chamber 246.

On the sidewall 246a of the outer chamber 246, a slanted part 246c is formed at the same level as the wafer W held by the spin chuck 260, thereby surrounding the wafer W. Since the slanted part 246c is inclined from the upside of the height of the wafer W downward and outward, the droplets of the processing liquid scattering to the circumference of the wafer W hits on the slanted part 246c and further drops downward. Further, the openings 250, 252 open at the same level as the wafer W held by the spin chuck 260. The mechanical shutter 253 forms a part of the slanted part 246c. For example, when the transfer arm 234 gives and receive the wafer W to and from the spin chuck 260, the mechanical shutter 253 opens and the wafer W and the transfer arm 234 move through the opening 247 horizontally.

In the unit chamber 245, as shown in FIGS. 10 and 11, an en closed type nozzle chamber 277 is arranged so as to be adjacent to the outer chamber 246. In the nozzle chamber 277, there are accommodated an arm 279, a processing-fluid supplier 280 and an arm rotating unit 282. Further, an opening 284 is formed between the nozzle chamber 277 and the outer chamber 246.

In the nozzle chamber 277, a "nozzle-chamber" mechanical shutter 286 is arranged to open and close the opening 184. The "nozzle-chamber" mechanical shutter 286 is driven by a rotating mechanism 288 (e.g. motor) disposed in the nozzle chamber 277.

The processing-fluid supplier 280 is attached to the leading end of an arm 279. On the base end of the arm 279, an arm rotating unit 282 is equipped with a not-shown motor. By this motor, the arm 279 can rotate about the arm rotating unit 282 in a horizontal plane. Thus, entering the outer chamber 246 through the opening 284, the arm 279 is capable of rotating up to a position that the processing-fluid supplier 280 is present above at least the wafer's center. In this way, with the rotation of the arm 279, it is carried out to transfer the processing-fluid supplier 280 from at least the wafer's center to the periphery. The processing-fluid supplier 280 is capable of ejecting various processing fluids for processing the wafer W, for example, chemicals such as SC-1 liquid (mixture of ammonia water, hydrogen peroxide water and deionized water), $N_2$-gas, deionized water (DIW), mixture of $N_2$-gas and deionized water, etc.

In the outer chamber 246, as shown in FIG. 11, a top plate 290 (as the top-face member) is arranged above the wafer W held by the spin chuck 260. The top plate 290 is formed with a size to cover the upper surface of the wafer W held by the spin chuck 260.

Figure 14:
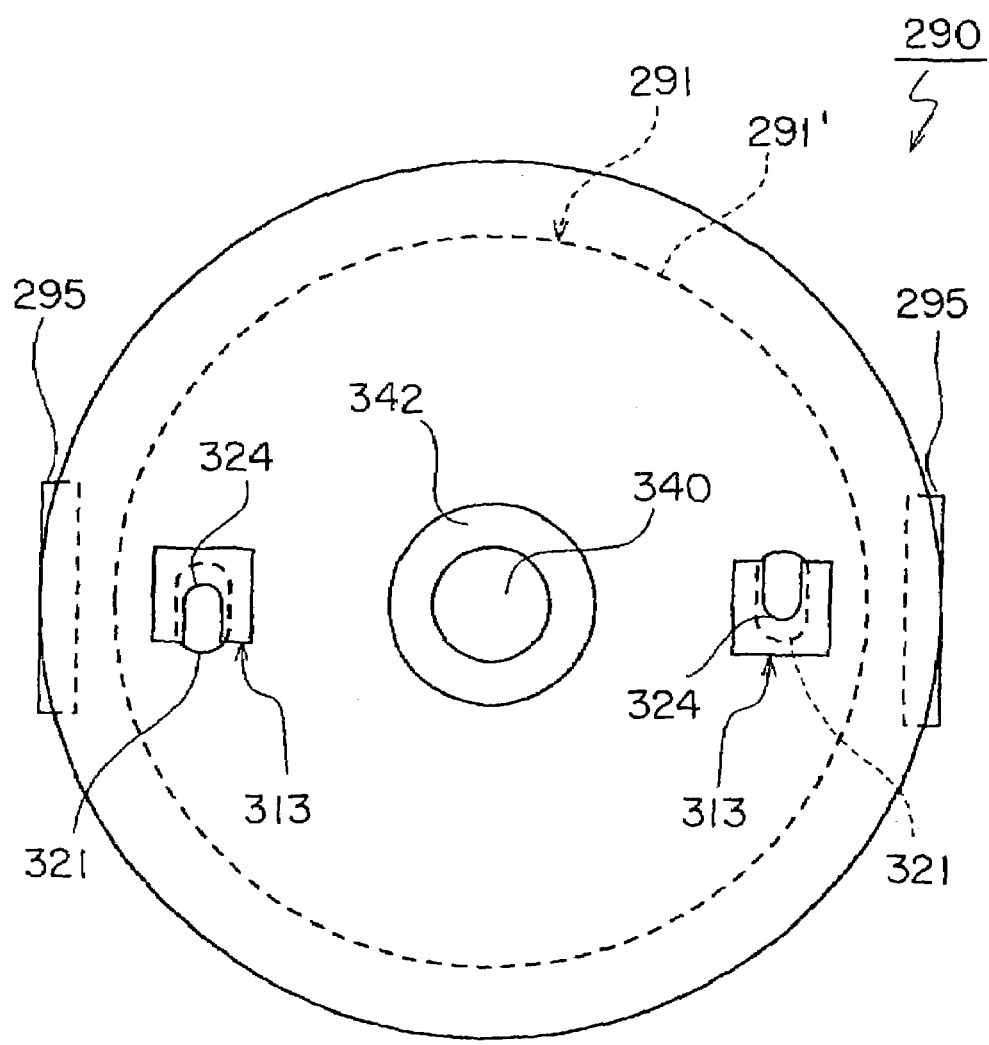
FIG. 14 is a plan view of the top plate.
Figure 15:
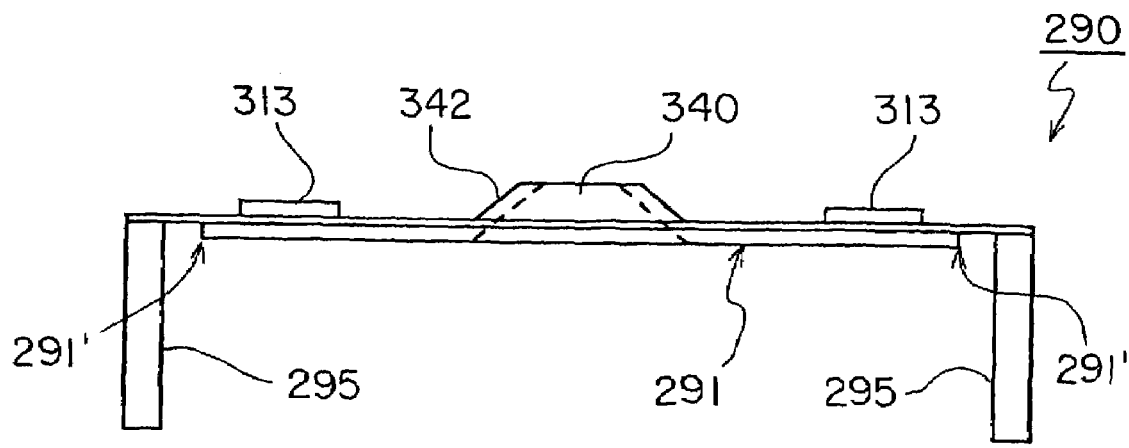
FIG. 15 is an elevational view of the top plat.

As shown in FIGS. 14 and 15, the top plate 290 has a downward-projecting face 291 formed on the lower surface to cover the whole upper surface of the wafer W. An edge 291' of the face 291 is positioned some what out side of the peripheral edge of the upper surface of the wafer W. On the periphery of the top plate 290, engagement convex members 195 are fixed to the plate 290 in two opposite positions around the center of the plate 290. Each of the engagement convex members 195 is in the form of a column member succeeding the top plate 290 perpendicularly. The engagement convex members 195 are respectively engaged, at their lower ends, with engagement concave members 297 described later. Even when arranging the top plate 290 above the wafer W, there is produced a sufficient gap between the engagement convex members 295 and the periphery of the wafer W held by the spin chuck 260. In addition, even when the top plate 290 moves up and down against the spin chuck 260 and also the wafer W held by the spin chuck 260, the engagement convex members 295 are arranged so as not to interfere with the spin chuck 260 and the wafer W.

On the other hand, the engagement concave members 297 are secured to the chuck plate 265, in two positions about the periphery. As shown in FIG. 16, each engagement concave member 297 is provided with a recess 298 opening upward. In arrangement, the lower ends of the engagement convex members are respectively inserted into the recesses 298 of the members 297 from the upside. The engagement concave members 297 are arranged below the periphery of the wafer W held by the spin chuck 260. Further, each recess 298 is formed by a tapered face diverging from its bottom upward, allowing the lower end of the engagement convex member 295 to be inserted into the recess 298 smoothly.

In the state that the lower faces of the engagement convex members 295 abut on the bottoms of the recesses 298 respectively, the engagement convex members 295 are supported by the engagement concave members 297 respectively. Since the engagement convex members 295 respectively engage with the engagement convex members 295 at two opposing positions in the circumference of the center of the top plate 290 as a center, it can be carried above the wafer W held by the spin chuck 260, stably. In this way, owing to the top plate's own weight, the top plate 290 is engaged with the spin chuck 260. Further, the top plate 290 is disengage able from the spin chuck 260.

When the motor 272 rotates the spin chuck 260 in engagement with the top plate 290, it becomes possible to rotate the top plate 290 and the spin chuck 260 in one body. When the spin chuck 260 is carrying the wafer W, all of the spin chuck 260, the wafer W and the top plate 290 rotate as one. Thus, since the motor 272 can rotate the top plate 290, it is unnecessary to provide an exclusive rotating mechanism (e.g. motor) for the top plate 290 besides the existing motor 272. Accordingly, in comparison with the conventional substrate processing apparatus equipped with exclusive rotating mechanisms for the top plate and the spin chuck, it is possible to reduce the installation cost for the rotating mechanisms remarkably and also possible to reduce the number of particles produced from the rotating mechanisms. Further, since no elevating mechanism (e.g. rotating mechanism, cylinder) for the top plate 290 is arranged on the upside of the held wafer W, for example, the upper part of the chamber 246 (i.e. the top of the ceiling part 246b), there is no fear that the particles might invade the circumference of the wafer W, thereby preventing an influence of the particles on the wafer W.

Figure 17:
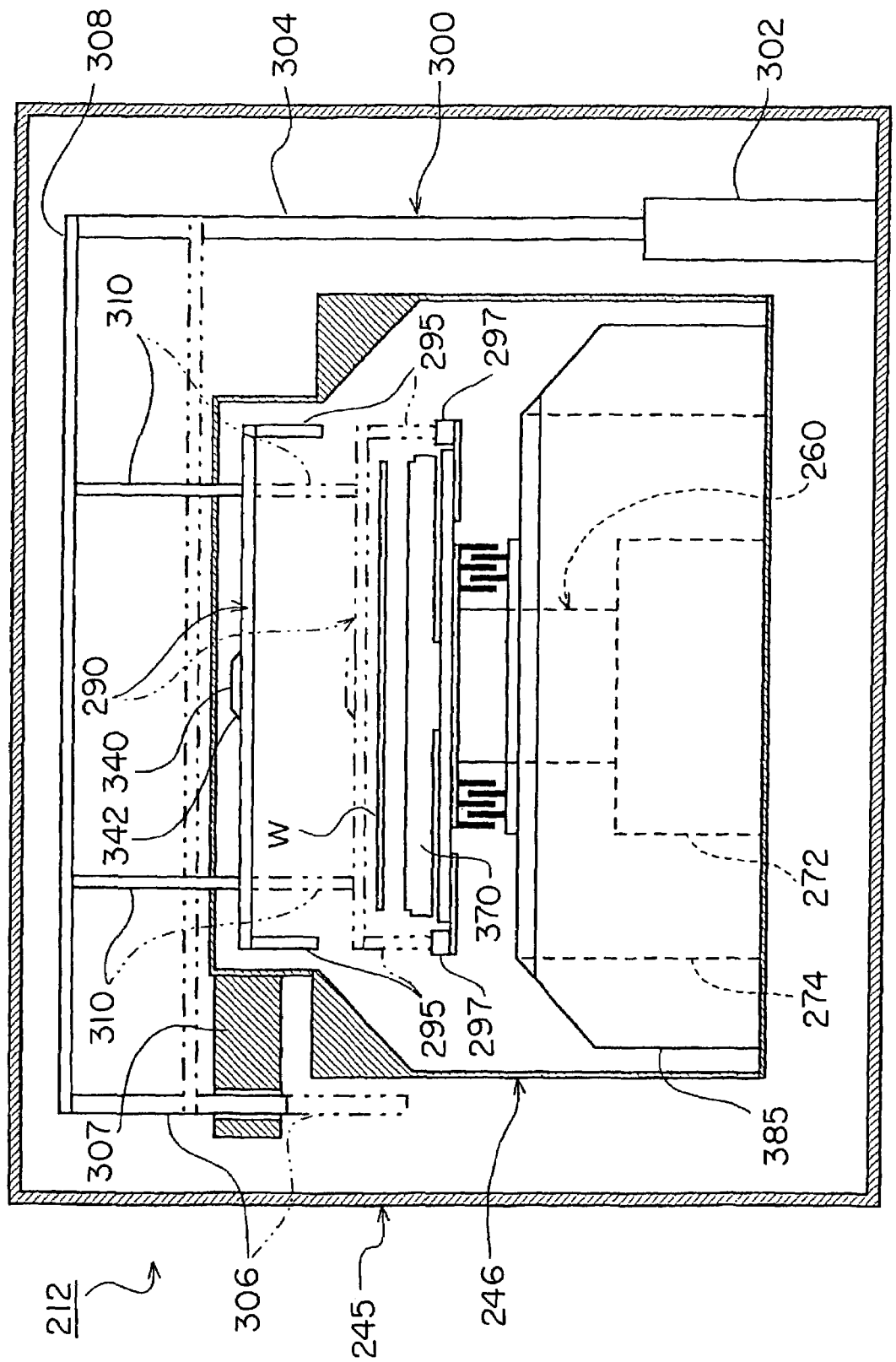
FIG. 17 is a longitudinal sectional view of the substrate processing apparatus, explaining the rise and fall of the top plate.

As shown in FIG. 17, a "top-plate" elevating mechanism 300 is arranged outside the outer chamber 246, for lowering the top plate 290 to a position for engagement with the spin chuck 260 and raising the plate 290 to a position for separation from the spin chuck 260. The "top-plate" elevating mechanism 300 comprises a "top-plate" elevating cylinder 302, an elevating rod 304, a supporting rod 306, an elevating member 308 and "plate-elevation" supporting members 310. Noted that the substrate cleaning unit 212 is adapted in a manner that even if the particles are produced due to the operation of the "top-plate" elevating mechanism 300, the particles would not invade the circumference of the wafer W accommodated in the outer chamber 246.

The "top-plate" elevating cylinder 302 is arranged in the lower part of the unit chamber 245 to make the elevating rod 304 beside the outer chamber 246 rise and fall in the longitudinal direction. The supporting rod 306 is arranged in a position opposite to the elevating rod 304 over the outer chamber 246. The supporting rod 306 is movable up and down in a rod guide 307 secured on the outer surface of the outer chamber 246. Arranged above the outer chamber 246 is the elevating member 308 whose both ends are supported by the upper end of the elevating rod 304 and the upper end of the supporting rod 306, respectively. With the drive of the "top-plate" elevating cylinder 302, the elevating member 308 moves up and down between the ceiling face of the unit chamber 245 and the upside of the ceiling part 246b of the outer chamber 246. Two "plate-elevation" supporting members 310 are arranged to penetrate the ceiling part 246b and enter the outer chamber 246. These "plate-elevation" supporting members 310 have respective upper ends secured to the elevating member 308. While, the respective lower ends of the "plate-elevation" supporting members 310 are adapted so as to move up and down in the outer chamber 246.

Figure 18A:
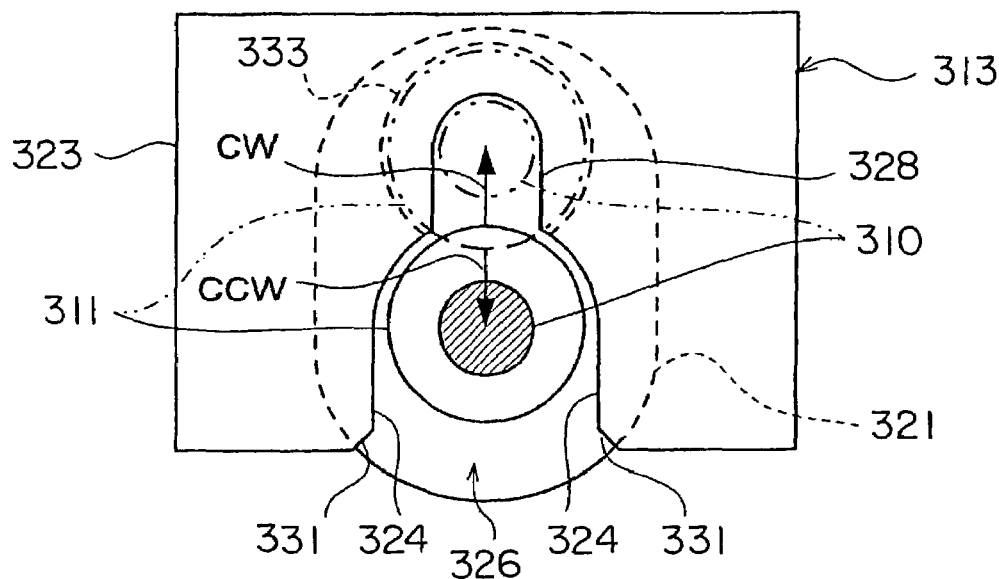
FIG. 18A is a plan view explaining the engagement of a "plate-elevation" supporting member with an engaging part of the top plate.
Figure 18B:
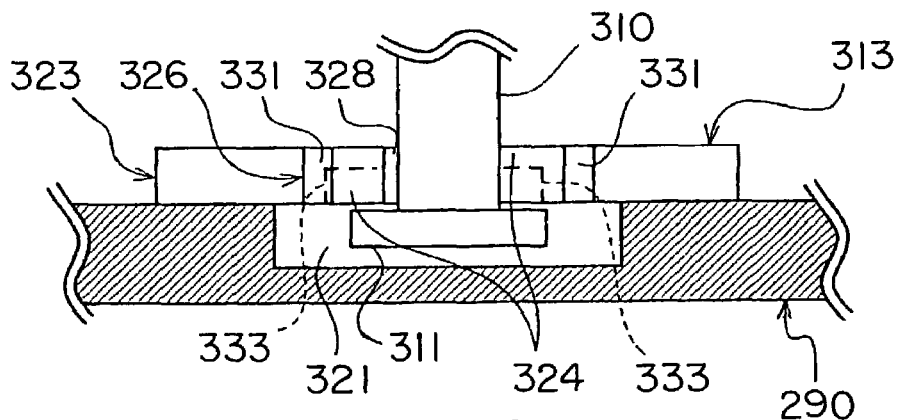
FIG. 18B is a front sectional view of FIG. 18A
Figure 18C:
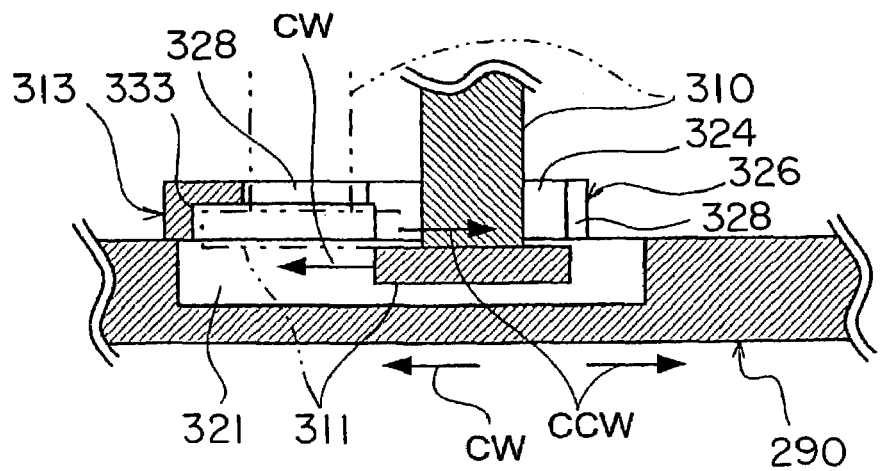
FIG. 18C is a side sectional view of FIG. 18A.

As shown in FIGS. 18A, 18B and 18C, each "plate-elevation" supporting member 310 is provided, on the lower end, with a flange 311. On the other hand, the top plate 290 is provided, on its upper face, with two engaging parts 313 for engagement with the flanges 311 of the "plate-elevation" supporting members 310, as shown in FIGS. 14 and 15. The engaging parts 313 in pairs are respectively engageable with the flanges 311 of the "plate-elevation" supporting members 310 at opposing positions around the middle of the top plate 290 as the center. With this structure, the "plate-elevation" supporting members 310 can support the top plate 290 stably. On condition that the top plate 290 is engaging with the "plate-elevation" supporting members 310, the drive of the "top-plate" elevating cylinder 302 allows the top plate 290 to rise and fall in integral with the elevating rod 304, the supporting rod 306, the elevating member 308 and the "plate-elevation" supporting members 310.

Noted that there is no rotating mechanism for the top plate 290 above the outer chamber 246 and the "top-plate" elevating cylinder 302 is arranged in the lower part of the unit chamber 245. Thus, in comparison with the arrangement where a rotating mechanism for the top plate 290 and a cylinder for integrally elevating the top plate 290 and the above rotating mechanism are arranged above the wafer W in the processing position, there is no anxiety that particles from the rotating mechanism and the cylinder invade the circumference of the wafer W, whereby the influence of particles on the wafer W can be reduced.

As shown in FIGS. 18A, 18B and 18C, hollows 321 are formed on the upper surface of the top plate 290, for receiving the flanges 311. Each hollow 321 has a size allowing the flange 311 to move in the hollow 321 in the rotating direction of the top plate 290 relatively. Above the hollow 321, a lid 323 is secured on the top plate 290, for covering part of the hollow 321. Further, the lid 323 is provided with a notch 324. On one side of the lid 323, a port 326 is formed to allow the flange 311 and the "plate-elevation" supporting member 310 to come in and out of the notch 324. On both sides of the port 326, tapered chamfers 331 are formed to facilitate the insertion of the flange 311 into the notch 324 through the port 326.

In the back of the notch 324, a fit groove 328 is formed to fit with a lateral face of the "plate-elevation" supporting member 310. On the lower part of the fit groove 328, a flange-fitting groove 333 is formed to fit with the flange 311 of the member 310. For example, after inserting the flange 311 and the "plate-elevation" supporting member 310 into the notch 324 through the port 326, it is carried out to lower the flange 311 into the hollow 321 and further rotate the top plate 290 in the counter-clockwise direction by rotating the spin chuck 260. Then, the "plate-elevation" supporting member 310 moves toward the fit groove 328 in the clockwise direction relatively and finally fits with the fit groove 328. Thereafter, by elevating the flange 311, it can be engaged into the flange-fitting groove 333. When the "plate-elevation" supporting member 310 is raised while engaging the member 310 and the flange 311 into the fit groove 328 and the flange-fitting groove 333 respectively, the upper face of the flange 311 abuts on the upper face of the flange-fitting groove 333 since the flange 311 is unable to pass the fit groove 328.

We now describe methods of engaging/disengaging the "plate-elevation" supporting members 310 with/from the engaging parts 313.

When engaging the "plate-elevation" supporting members 310 with the engaging parts 313, it is first carried out to make each of the "plate-elevation" supporting members 310 stand ready in the front position of the mating engaging part 313 in the counter-clockwise (CCW) direction, namely, in front of the port 326. That is, it is executed to make the spin chuck 260 and the top plate 290 stand still so that the engaging parts 313 each stands ready in a predetermined position. In addition, it is carried out to lower the "plate-elevation" supporting members 310 so that the lower surfaces of the flanges 311 approach the upper face of the top plate 290. Next, by integrally rotating the spin chuck 260 and the top plate 290 in the counter-clockwise direction by a predetermined distance, it is carried out to transfer the flanges 311 and the "plate-elevation" supporting members 310 to the engaging parts 313 relatively in the clockwise direction (CW), thereby inserting the members 310 into the notches 324 through the ports 326 respectively. Further, by lowering the members 310, the flanges 311 are lowered into the hollows 321. Subsequently, when rotating the spin chuck 260 and the top plate 290 slightly in the counter-clockwise direction, the flanges 311 are displaced in the hollows 321 in the clockwise direction relatively and furthermore, the members 310 are relatively displaced toward the fit grooves 328 in the clockwise direction. Next, by raising the members 310, the flanges 311 are elevated from the hollows 321 to engage with the flange-fitting groove 333, respectively. Consequently, the engaging parts 313 engage with the "plate-elevation" supporting members 310 respectively, allowing the top plate 290 to be elevated. As for the access of the "plate-elevation" supporting members 310 to the engaging parts 313, it may be carried out to lower the members 310 and the flanges 311 from the upper side of the notches 324 into the hollows 321, alternatively.

When separating the "plate-elevation" supporting members 310 from the engaging parts 313 respectively, it is first carried out to engage the top plate 290 with the spin chuck 260. That is, by rotating the spin chuck 260, the engagement concave members 297 are moved to predetermined engagement positions. While, by lowering the top plate 290 supported by the "plate-elevation" supporting members 310, the engagement convex members 295 are engaged with the engagement concave members 297, respectively. Thereafter, it is carried out to lower the flanges 311 of the members 310 into the hollows 321 respectively, thereby canceling the engagement. Then, the flanges 311 are moved into the hollows 321 relatively, in the reverse direction to the previously-mentioned direction in engaging the members 310 with engaging parts 313. That is, for example, by integrally and slightly rotating the spin chuck 260 and the top plate 290 in the clockwise direction, the flanges 311 move in the hollows 321 relatively in the counter-clockwise direction and the "plate-elevation" supporting members 310 move against the fit grooves 328 relatively in the counter-clockwise direction, so that the engagement between the members 310 and the engaging parts 313 is released. Further, with the drive of the "top-plate" elevating mechanism 300, it is carried out to raise the members 310 and the flanges 311 from the inside of the hollows 321 into the notches 324 and further raise the members 310 and the flanges 311 to the upper side of the notches 324 for withdrawal. In this way, it is possible to separate the "plate-elevation" supporting members 310 from the engaging parts 313 respectively. Note, in withdrawing the members 310 and the flanges 311 from the notches 324, it may be carried out to rotate the spin chuck 260 and the top plate 290 in the clockwise direction furthermore, thereby allowing the members 310 and the flanges 311 to pass through the ports 326 relatively in the counter-clockwise direction.

In this way, the "plate-elevation" supporting members 310 are engageable with and disengage able from the top plate 290. Further, the engagement/disengagement between the "plate-elevation" supporting members 310 and the engaging parts 313 can be accomplished by making the spin chuck 260 engage with the top plate 290 and further rotating them integrally.

When driving the "top-plate" elevating mechanism 300 on condition that the "plate-elevation" supporting members 310 engage with the top plate 290, it becomes possible to move the top plate 290 in relation to the spin chuck 269 up and down. Further, when moving the top plate 290 in relation to the spin chuck 260 up and down on condition that the spin chuck 160 holds the wafer W, it is possible to lower the top plate 290 to a position (dash line) close to the wafer W and also possible to elevate the plate 290 to a position (solid line) apart from the wafer W. Further, by moving the top plate 290 up and down, it is possible to insert the engagement convex members 295 into the recesses 298 of the engagement concave members 297 and also possible to withdraw the members 295 from the recesses 298, respectively. That is, it is possible to engage the top plate 290 with the spin chuck 260 and also possible to disengage the top plate 290 from the spin chuck 260.

We now describe methods of engaging the top plate 290 with the spin chuck 260 and also separating the former from the latter. In order to engage the top plate 290 with the spin chuck 260, it is carried out to move the engagement concave members 297 under the engagement convex members 295 raised by the "top-plate" elevating mechanism 300, at first. For this, the spin chuck 260 is rotated so that the engagement concave members 297 occupy predetermined positions respectively. Continuously, the descent of the top plate 290 allows the lower ends of the engagement convex members 295 to be inserted into the recesses 298 of the engagement concave members 297, respectively. In this way, the engagement between the engagement concave members 297 and the engagement convex members 295 is accomplished. In other words, the top plate 290 is engaged with the spin chuck 260. On the other hand, in order to separate the top plate 290 from the spin chuck 260, it is carried out to engage the "plate-elevation" supporting members 310 with the engaging parts 313, at first. Then, the ascent of the top plate 290 due to the drive of the "top-plate" elevating mechanism 300 causes the engagement convex members 295 to withdraw from the recesses 298, allowing the members 295 to be separated from the engagement concave members 297. In this way, the top plate 290 is separated from the spin chuck 260.

If the top plate 290 is engaged with the spin chuck 260 and further, the supporting members 310 are separated from the engaging parts 313, then the top plate 290 is supported by the spin chuck 260 only. Under such a situation, the rotation of the spin chuck 260 allows the top plate 290 to be rotated in integral with the spin chuck 260. While, on condition of separating the top plate 290 from the spin chuck 260, it is possible to rotate the spin chuck 260 and the wafer W in a body without rotating the top plate 290.

If engaging the top plate 290 with the spin chuck 260 while it is carrying the wafer W, there is established a condition that the top plate 290 approaches the upper surface of the wafer W. Then, a narrow gap of the order of 1 mm is formed between the top plate 290 and the wafer W. on the other hand, when elevating the top plate 290 away from the spin chuck 260, the lower surface of the top plate 290 moves away from the upper surface of the wafer W. Then, there is defined a space having a height of, for example, the order of 100 mm between the top plate 290 and the wafer W. Owing to the formation of such a sufficient space between the lower surface of the top plate 290 and the upper surface of the wafer W, it becomes possible to move the processing-fluid supplier 280 into the space, allowing the upper surface of the wafer to be supplied with the processing fluid. Additionally, when any one of the transfer arms 234, 235, 236 transfers the wafer W to and from the spin chuck 269, it is possible to give and receive the wafer W to and from the spin chuck 269 easily.

Regarding the movements of the processing-fluid supplier 280 and the arm 279 above the wafer W, as shown in FIG. 10, the engagement convex members 295 and the engagement concave members 297 are arranged in a manner that the arm 279 can rotate toward the upper side of the wafer W through an interval between two engagement convex members 295 opposing in the circumference of the wafer W. That is, with the rotations of the top plate 290 and the spin chuck 260, it is carried out to move the engagement convex members 295 and the engagement concave members 297 to respective positions in non-contact with the processing-fluid supplier 280 and the arm 279. After completing the rotations, the top plate 290 is separated from the spin chuck 260, allowing the processing-fluid supplier 280 to approach the upper side of the wafer W through the interval between two engagement convex members 295 at a standstill. Alternatively, it may be carried out to move the engagement convex members 295 up to respective positions in non-contact with the processing-fluid supplier 280 and the arm 279. As well, when transferring the wafer W in relation to the spin chuck 260, the engagement convex members 295 or the engagement concave members 297 are arranged in respective positions in non-contact with the transfer arms 234, 235, 236 and the wafer W.

As shown in FIGS. 14 and 15, the top plate 290 is provided, at a middle part thereof, with a supply hole 340 for passage of the processing fluid for the wafer W. In supplying the wafer W with the processing fluid, it can be supplied from the upper side of the hole 340 to the vicinity of the wafer's center. In the periphery of the supply hole 340, a tapered part 342 is formed to incline from the center of the top plate 290 toward the periphery downward.

Figure 19:
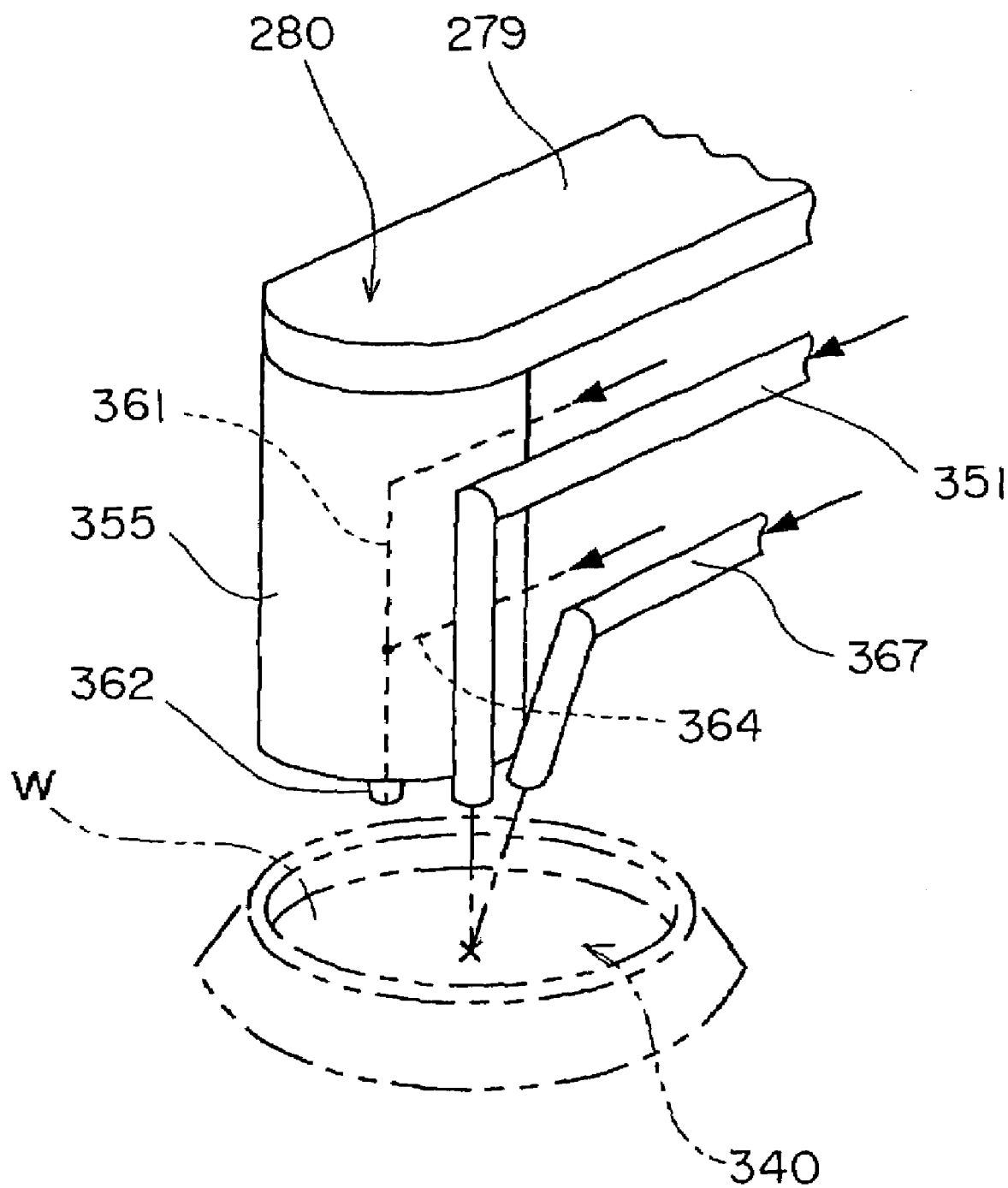
FIG. 19 is a perspective view explaining the constitution of a processing-liquid nozzle, a two-fluid mixing nozzle and a dry-gas nozzle.

When the processing-fluid supplier 280 supplies the upper surface of the wafer W with the processing fluid (e.g. chemical liquids, deionized water, etc.), the processing fluid ejected from the supplier 280 is supplied to the vicinity of the wafer's center through the supply hole 340, while the spin chuck 260, the top plate 290 engaging with the spin chuck 260 and the wafer W held by the spin chuck 260 are rotated in a body. Thus, due to centrifugal force of the rotating wafer W, the processing fluid flows from the vicinity of the wafer's center toward the periphery. Since the top plate 290 engages with the spin chuck 260 while forming a narrow gap between the lower surface of the top plate 290 and the upper surface of the wafer W, it is possible to interpose only the processing fluid in the gap. Therefore, the wafer W can be processed with a small amount of processing fluid. The top plate 290 has a lower face 291 formed on its lower surface. In connection, if the lower face 291 is formed so that its periphery 291' takes a position somewhat outside the wafer's periphery in the radial direction, then it becomes possible to spread a chemical membrane up to the wafer's periphery easily. As shown in FIG. 19, the processing-fluid supplier 280 includes a processing-liquid nozzle 351 (as the processing-fluid nozzle) for both of the chemical liquid and the rinsing liquid, a two-fluid mixing nozzle 355 for mixed fluid and a dry-gas nozzle 357. The leading end of the arm 279 carries these nozzles 351, 355, 357.

Figure 20:
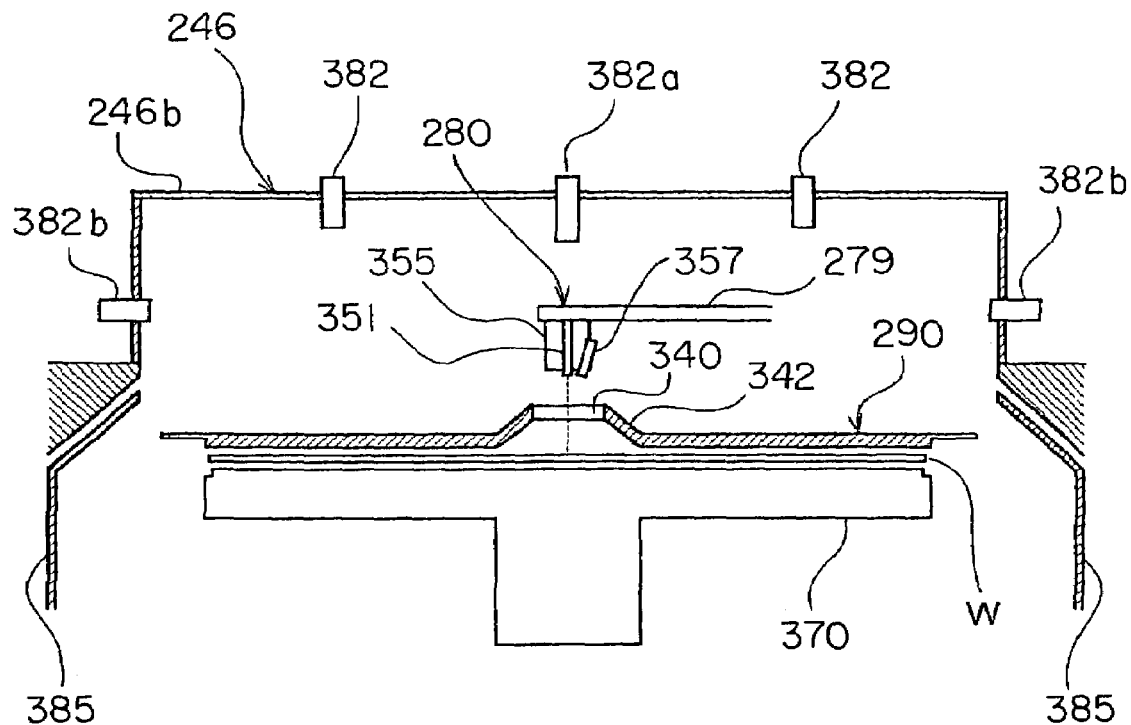
FIG. 20 is an explanatory view explaining a condition that the top plate approaches a wafer to supply a processing fluid to the wafer through a supply port.

The processing-fluid nozzle 351 supplies the chemical liquid, for example, SC-1 liquid (i.e. mixture of ammonia water, hydrogen peroxide water and deionized water) or the rinsing liquid, for example, the deionized water. The processing liquid that the processing-fluid nozzle 351 supplies is selected between the SC-1 liquid and the deionized water, by not-shown switching means. The processing-fluid nozzle 351 moves to the upside of the wafer W or the upside of the top plate 90 with the pivot of the arm 279. In order to supply the wafer W with the chemical liquid or the rinsing liquid, it is carried out to move the processing-fluid nozzle 351 to the upside of the supply hole 340 on condition of lowering the top plate 290 as shown in FIG. 20 and further executed to supply the chemical liquid or the rinsing liquid toward the vicinity of the wafer's center through the processing-fluid nozzle 351.

In the two-fluid mixing nozzle 355, a water feed path 361 is formed to allow the deionized water to pass through. A nozzle hole 362 is formed at the tip of the two-fluid mixing nozzle 355. The deionized water fed through the water feed path 361 is ejected from the nozzle hole 362 downward. Also in the two-fluid mixing nozzle 355, an $N_2$-gas path 364 for feeding $N_2$-gas is interposed in the water feed path 361. A path portion where the $N_2$-gas path 364 connects with the water feed path 361 forms a mixing part for mixing the deionized water and $N_2$-gas. At this mixing part, pressure is applied on the deionized water by $N_2$-gas, so that the mixed fluid consisting of $N_2$-gas and the deionized water as a mixture is ejected through the nozzle hole 362. Thus, it is possible to spray the deionized water to the wafer W through the nozzle hole 362. With the pivot of the arm 279, the two-fluid mixing nozzle 355 moves to the upside of the wafer W. Noted that it may be carried out to dissolve carbon dioxide ($CO_2$) in the deionized water through the water feed path 361. Then, this dissolution has the effect of reducing static electricity.

Figure 21:
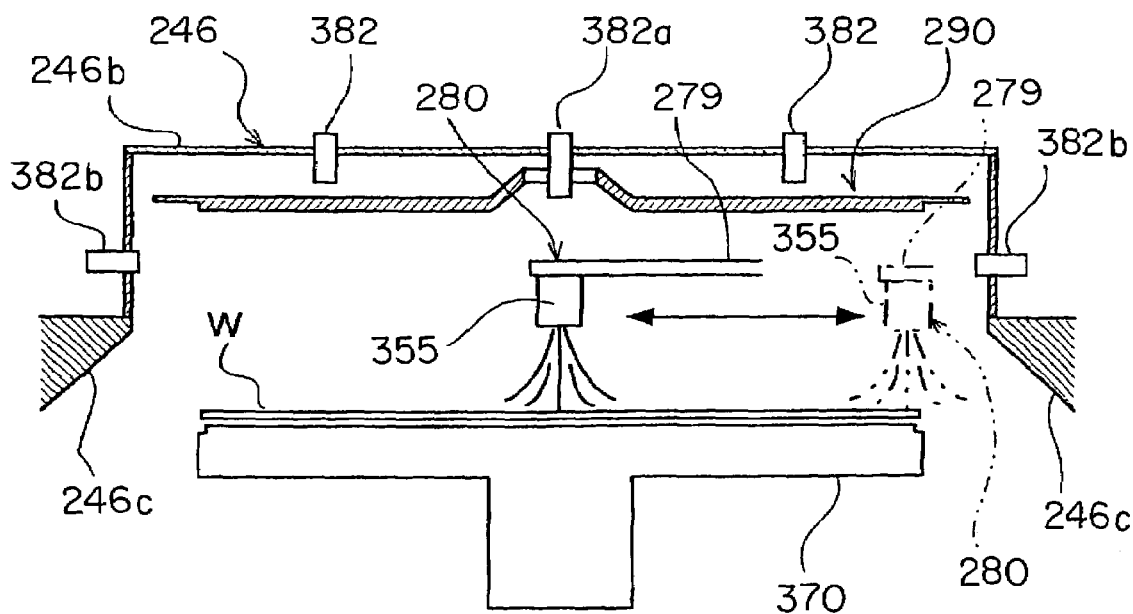
FIG. 21 is an explanatory view explaining a condition that the top plate is separated from the wafer and a processing fluid is supplied to the wafer by the two-fluid mixing nozzle moving.

In case of processing the wafer W with the mixed fluid, as shown in FIG. 21, the top plate 290 is separated from the spin chuck 260. Further, with the rotation of the arm 279, it is carried out to transfer the two-fluid mixing nozzle 355 from at least the wafer's center to the periphery while rotating the wafer W in integral with the spin chuck 260, supplying the mixed fluid all over the upper surface of the wafer W. In this way, by spraying the mixed fluid all over the upper surface of the wafer W, the particles on the wafer W are blown off by the mixed fluid, accomplishing the effective removal of particles.

Under condition of accommodating the arm 279 in the nozzle chamber 277, the two-fluid mixing nozzle 355 and the processing-liquid nozzle 351 are positioned along a direction extending from the periphery of the wafer W toward the outside of the wafer W, in this order. That is, the arm 279 is constructed in a manner that when it pivots from the wafer's center toward the periphery, the two-fluid mixing nozzle 355 follows the processing-liquid nozzle 351. With this structure, when removing the rinsing liquid and the particles from the wafer W by the mixed fluid supplied through the nozzle 355 after completing the rinsing process using the rinsing liquid through the nozzle 351 an seven if the processing liquid, such as rinsing liquid, drops from the nozzle 351 during processing the wafer W with the mixed fluid, it is possible to blow the so-dropped processing liquid out of the wafer W owing to the mixed fluid. Thus, it is possible to prevent the dropped processing liquid from adhering to the wafer W.

For example, the dry-gas nozzle 357 supplies $N_2$-gas as the dry gas. With the pivot of the arm 279, the above nozzle 357 moves to the upside of the wafer W.

In the substrate cleaning unit 212 mentioned above, there can be performed a process to form a narrow gap between the top plate 290 and the upper surface of the wafer W thereby supplying the gap with a processing fluid and another process to move the processing-fluid supplier 280 to the upside of the wafer W while rotating the wafer W thereby supplying the wafer W with the processing fluid.

Except the wafer's portion corresponding to the supply hole 340, the wafer's upper surface is covered with the top plate 290. It may be feared that the SC-1 liquid or the deionized water as the rinsing liquid, which has been left in the nozzle 151, falls from the "processing-liquid" nozzle 351 during its withdrawal from the upside of the supply hole 340. Nevertheless, since these droplets are received by the upper surface of the top plate 290, there is no possibility of adhering to the wafer W. Particularly, since the periphery of the supply hole 340 includes the tapered part 342 which is gradually inclined downward as it approaches the periphery of the top plate 290, the droplets falling on the tapered part 342 moves along the tapered part 342 and toward the circumference of the plate 290. Thus, there is no fear that the droplets invade into the supply hole 340. Even if the droplets falls on the surface (part) of the top plate 290 outside the taper part 342, they do not enter the supply hole 340 since the tapered part 342 is formed so as to project from the other part of the plate 290. Note, the droplets of the SC-1 liquid or the deionized water falling on the top plate 290 flow toward its periphery due to the rotation of the plate 290 and are drained to the circumference of the plate 290.

Below the wafer W held by the spin chuck 260, as shown in FIG. 11, there is arranged an under plate 370 which approaches the wafer W from its underside thereby to cover the lower surface of the wafer W. Inside the rotary cylinder 267, an under-plate shaft 371 supporting the under plate 370 is arranged to penetrate an inner cavity of the rotary cylinder 267. The under-plate shaft 371 is secured on the upper face of a horizontal plate 374. By an "under-plate" elevating mechanism 375, such as air cylinder, the horizontal plate 374 is vertically moved up and down in a body with the under-plate shaft 371. Accordingly, the under plate 370 is movable up and down between a high "processing" position to apply a processing on the lower surface of the wafer W held by the spin chuck 260 and a low "standby" position apart from the lower surface of the wafer W held by the spin chuck 260. Noted that there is no fear that the particles from the "under-plate" elevating mechanism 375 invade the circumference of the wafer W since the mechanism 375 is positioned below the outer chamber 246.

The under plate 370 is formed so that its upper periphery (edge) 370' takes a position somewhat outside the periphery of the wafer W carried by the spin chuck 260, in the radial direction. Thus, the upper surface of the under plate 370 is adapted so as to cover the whole lower surface of the wafer W. As shown in FIGS. 13A and 13B, the under plate 370 is provided, on an upper edge thereof, with a slight recess 377 which extends in the circumference direction of the plate 370. As shown in FIG. 13B, when the under plate 370 approaches the lower surface of the wafer W, the support pins 271 enter the recess 377, thereby preventing the interference of the under plate 370 with the support pins 271. Owing to the provision of the recess 377, it is possible to narrow a gap between the upper surface of the under plate 370 and the lower surface of the wafer W furthermore. Since the recess 377 is formed along the whole periphery of the under plate 370, the support pins 271 do not interfere with the under plate 370 irrespective of rotational position of the wafer W in relation to the under plate 370.

In FIG. 12, the under plate 370 is equipped with a "lower-surface" passage 378 to supply the lower surface of the wafer W with processing fluids, for example, the chemical liquid (e.g. the SC-1 liquid, liquid of HF), deionized water, $N_2$-gas (as dry gas) and so on. The "lower-surface" passage 378 is formed to penetrate the under-plate shaft 371 and also the under plate 370. By supplying a chemical liquid through the "lower-surface" passage 378 while rotating the wafer W, it becomes possible to diffuse the chemical liquid between the upper surface of the under plate 370 and the lower surface of the wafer W thereby forming a liquid membrane therebetween. Then, since the under plate 370 is formed so that the upper periphery 370' takes a position some what out side the periphery of the wafer W, it is possible to spread the chemical membrane up to the periphery of the wafer W owing to surface tension of the chemical liquid.

Below the under plate 370, an $N_2$-gas passage 380 is formed to supply $N_2$-gas as the inert gas. The $N_2$-gas passage 380 penetrates the under-plate shaft 371. Through the $N_2$-gas passage 380, $N_2$-gas is supplied to a space between the upper surface of the chuck plate 265 and the lower surface of the under plate 370 and also a cavity inside the rotary cylinder 267. These spaces are filled up with $N_2$-gas for purpose of purge. Owing to the purge effect of $N_2$-gas, it becomes possible to prevent an atmosphere between the chuck plate 265 and the under plate 370 from being exposed to negative pressure in rotating the wafer W. Thus, it is possible to prevent particles originating in the rotation of the motor 272 from passing through the cavity in the rotary cylinder 267 and further invading the space between the chuck plate 265 and the under plate 370.

As shown in FIG. 11, the outer chamber 246 is provided, on an upper part thereof, with purge-gas nozzles 382 which supply the inert gas, such as $N_2$-gas, or air into the chamber 246. The purge-gas nozzles 382 are arranged in the sidewall 246a (upper part) and the ceiling part 246b at several positions. In operation, when the top plate 290 is lowered, the nozzles 382 expel the inert gas, such as $N_2$-gas, or air onto the top plate 290, thereby forming the downflow in the outer chamber 246. Further, the space between the upper surface of the top plate 290 and the outer chamber 246 is purged by the inert gas, such as $N_2$-gas, or air supplied through the nozzles 382. As a result, it is possible to prevent the chemical liquid vapor from invading the upper space through the circumference of the wafer W. In this way, since the downflow (purge) gas is supplied through the nozzles 382 in supplying the processing liquid to the wafer W and during processing the wafer W, it is possible to prevent the atmosphere of the processing liquids, such as chemical atmosphere and steam atmosphere, from remaining in the upper area inside the chamber 246.

When processing a hydrophobic wafer W, the purge-gas nozzles 382 supply $N_2$-gas as the downflow (purge) gas. Then, it is possible to produce an effect to prevent an occurrence of water-marks on the surface of the hydrophobic wafer W. While, when processing a hydrophilic wafer W, the nozzles 382 may supply air in view of reducing the cost of downflow (purge) gas. Among the purge-gas nozzles 382, a purge-gas nozzle 382a right above the supply hole 340 is capable of projecting the top plate 290 through the supply hole 340 downward when the plate 290 rises. On the upper part of the sidewall 246a, a purge-gas nozzle 382b is arranged in a position allowing the nozzle 382b to eject gas beneath the top plate 290 when it rises. Accordingly, even when the top plate 290 is elevated, it is possible to form the downflow in the outer chamber 246 and also possible to fill the space between the top plate 290 and the wafer W with the inert gas, air or the like.

As shown in FIG. 11, the outer chamber 246 contains an inner cup 385 to surround the wafer W. Further, the outer chamber 246 is equipped with "outer-chamber" exhaust ports 390 each opening at the same level as the rotating wafer W, an "outer-chamber" drain pipe 393 for draining droplets in the outer chamber 46 and an "inner-cup" drain pipe 395 for draining droplets in the inner cup 385.

The inner cup 385 is movable between its lowered position and the elevated position. In the lowered position of the inner cup 385, there is established a condition where the spin chuck 260 projects above the upper end of the inner cup 385 to give and receive the wafer W. While, in the elevated position of the inner cup 385, there is established a condition where the cup 385 surrounds the wafer W to prevent the processing liquid etc. supplied on both sides of the wafer W from spattering in the circumference.

At two positions in the circumference of the wafer W, the "outer-chamber" exhaust ports 330 open in the sidewall 246a of the outer chamber 246 to discharge various atmospheres therefrom smoothly. As for the atmospheres, there are "processing-liquid" atmosphere flowing toward the periphery of the wafer W due to the rotation of the wafer W, the chuck plate 265 and the top plate 290; $N_2$-gas for dry; downflow gas; and $N_2$-gas for purge. The "outer-chamber" drain pipe 393 serves to discharge the processing liquid, which has been drained between the sidewall 246a and the outer wall of the cup 385, from the bottom part of the chamber 246. The "inner-cup" drain pipe 395 discharges the processing liquid from the interior of the inner cup 385.

Figure 22:
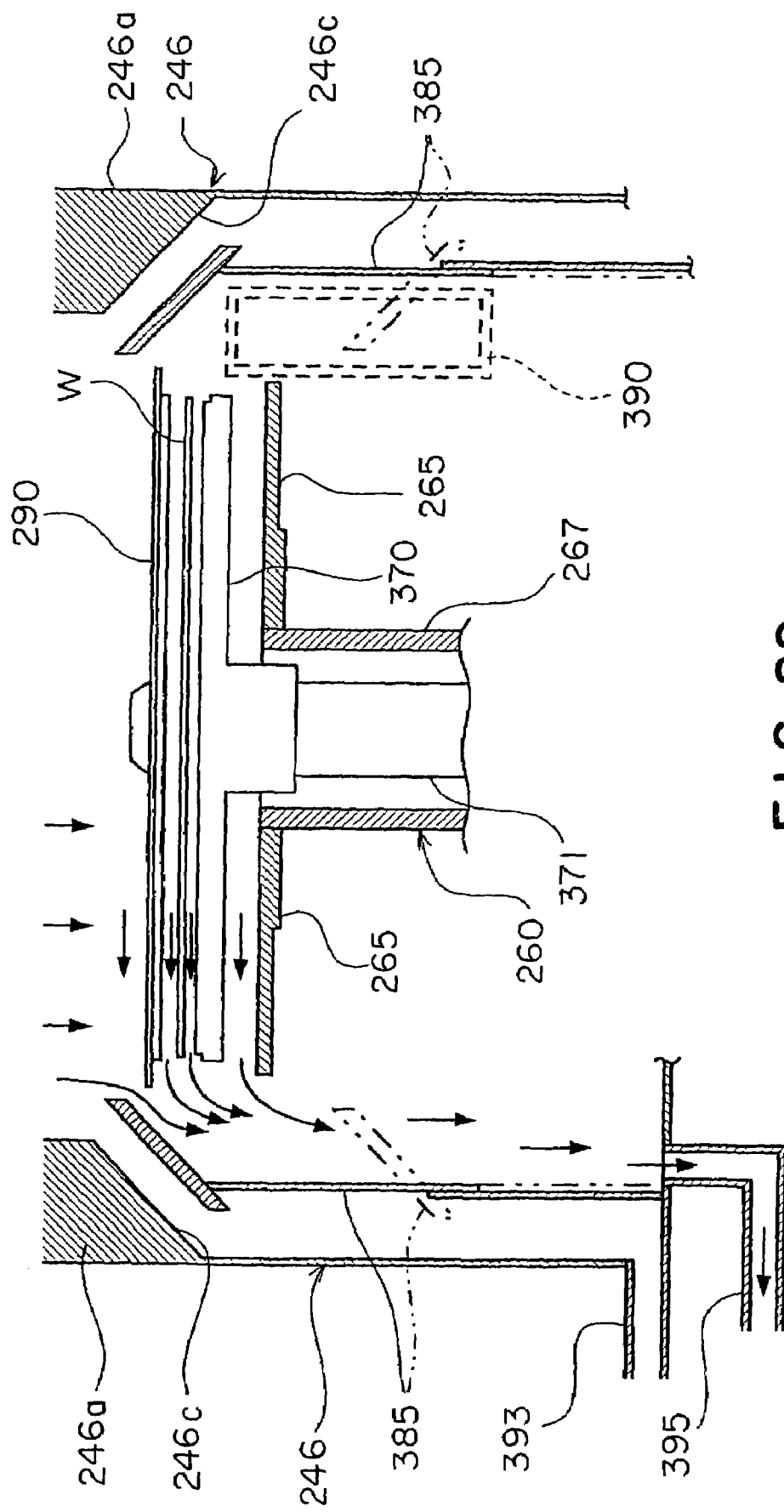
FIG. 22 is an explanatory view explaining the rise and fall of the inner cup and the flows of waste fluid and emission.

As shown in FIG. 22, when raising the inner cup 385 so as to surround the wafer W (see solid line), the upper part of the inner cup 385 approaches the slanted part 246c of the outer chamber 246, so that all of the droplets falling from the periphery of the wafer W, the atmosphere of the processing liquid, the processing fluid, the downflow (purge) gas, $N_2$-gas for purge, etc. flow inside the inner cup 385 downward and are discharged from the "inner-cup" drain pipe 395. While, when lowering the inner cup 385 so that the wafer W projects from the upper end of the inner cup 385 upward (dash line), the above fluids flow outside the inner cup 385 downward and are discharged from the "outer-chamber" drainpipe 393. When the wafer W rotates at high speed, these fluids blown off toward the sidewall 246a of the outer chamber 246 are discharged from the "outer-chamber" exhaust port 390.

In the cleaning system 1, the other substrate cleaning units 13, 14, 15 are similar to the above-mentioned substrate cleaning unit 212 in terms of its constitution, each allowing both sides of the wafer W to be cleaned simultaneously.

Now, in the cleaning system 1, a not-shown transfer robot first lays the carriers C each accommodating the wafers W, for example, twenty-five wafers W on the in/out port 4. Next, the pickup/accommodating arm 11 takes the wafers W out of the carrier C mounted on the in/out port 4 one by one and successively delivers the wafer W to the main wafer transfer unit 18. Next, by the transfer arm 34, the wafers W are appropriately brought into the substrate processing unit 212, 13, 14, and 15 where the contaminants, such as particles, are removed from the wafers W. In this way, the wafers W after completing the designated cleaning process are suitably unloaded from the substrate processing units 212, 13, 14, 15 by the main wafer transfer unit 18. Subsequently, the wafers W are delivered to the pickup/accommodating arm 11 one by one and successively accommodated in the carrier C again.

We now describe the cleaning operation at the substrate processing unit 212 representatively. As shown in FIG. 11, the "outer-chamber" mechanical shutter 253 of the substrate processing unit 212 opens at first. Then, the transfer arm 234 carrying the wafer W enters the outer chamber 246. At this time, the top plate 290 is elevated in advance, apart from a position where the wafer W is to be held by the spin chuck 260. That is, the top plate 290 is supported by the "plate-elevation" supporting members 310 and separated from the spin chuck 260, defining a gap enough to deliver the wafer W between the lower surface of the top plate 290 and the upper part of the spin chuck 260. Further, the inner cup 385 is lowered to make the upper part of the spin chuck 260 project upward. The under plate 370 is lowered in advance, apart from the position where the wafer W is to be held by the spin chuck 260. Between the upper surface of the under plate 370 and the upper part of the spin chuck 260, there is defined a gap enough to deliver the wafer W. Noted that the processing-fluid supplier 280 is accommodated in the nozzle chamber 277.

The main wafer transfer unit 218 moves the transfer arm 234 horizontally to deliver the wafer W to the support pins 271. The support pins 271 carry the wafer W in a manner that its surface for semiconductor device orientates upward. Then, the top plate 290 and the under plate 370 are together apart from the position (level) of the wafer W to be carried, so that the (two) engagement convex members 295 in the circumference of the top plate 290 have moved to respective positions in non-contact with the transfer arm 234 and the wafer W to be loaded. Therefore, the transfer arm 234 can deliver the wafer W to the support pins 271 easily. After delivering the wafer W to the support pins 271, the transfer arm 234 withdraws from the interior of the outer chamber 246 and thereafter, the "outer-chamber" mechanical shutter 253 is closed.

Next, the holding members 270 hold the periphery of the wafer W supported on the support pins 271. Then, the "top-plate" elevating mechanism 300 lowers the top plate 290 closer to the wafer W. As the engagement concave member 297 have already moved to their engagement positions in advance, the so-lowered engagement convex members 295 can engage with the engagement concave member 297 respectively. Then, there is produced a gap of the order of e.g. 1 mm, between the top plate 290 in the processing position and the upper surface of the so-held wafer W. On the engagement of the engagement convex members 295 with the engagement concave member 297, the spin chuck 260 is slightly rotated to separate the "plate-elevation" supporting members 310 from the engagement parts 313 respectively. In this way, after delivering the top plate 290 to the spin chuck 260, the "plate-elevation" supporting members 310 are elevated away from the top plate 290 by the "top-plate" elevating mechanism 300.

On the other hand, the under plate 370 rises to a position adjacent to the wafer W. Then, there is produced a gap of the order of e.g. 1 mm between the under plate 370 brought into the above adjacent position and the lower surface (back side) of the wafer W. Again, the inner cup 385 is elevated to surround the wafer W carried by the spin chuck 260.

First, the chemical processing for the wafer W is performed. With the pivotal movement of the arm 279, the processing-fluid supplier 280 moves from the inside of the nozzle chamber 277 to the upside of the top plate 290. Next, as shown in FIG. 20, the processing-liquid nozzle 351 ejects the SC-1 liquid (as the chemical liquid) against the vicinity of the wafer's center. The chemical liquid is supplied to the vicinity of the wafer's center through the supply hole 340. On the other hand, the spin chuck 260, the wafer W held by the spin chuck 260 and the top plate 290 are rotated in a body at low speed. The chemical liquid supplied to the vicinity of the wafer's center flows to the periphery of the wafer W due to the centrifugal force by the rotation of the wafer W. Further, the SC-1 liquid (as the chemical liquid) is supplied through the "lower-surface" passage 378, as well. Owing to the formation of narrow gaps between the top plate 290 and the upper surface of the wafer W and also between the under plate 370 and the lower surface of the wafer W, it is possible to interpose the chemical liquid only therebetween. On the formation of the chemical membranes on both sides of the wafer W, the chemical supply from the processing-fluid supplier 280 and the "lower-surface" passage 378 is stopped and continuously, the water W is rotated for a predetermined period at a lower speed than to collapse the chemical membranes on the wafer W. In this case, the wafer W can be processed with a small quantity of chemical liquid.

After completing the chemical processing on both sides of the wafer W, the chemical liquid is shaken off the spin chuck 260, the wafer W, the top plate 290 and the under plate 370 by rotating the spin chuck 260. The so-thrown-off chemical liquid is discharged in to the inner cup 385. Noted that, when throwing off the chemical liquid after the chemical processing, $N_2$-gas may be supplied from the processing-liquid nozzle 357 and the "lower-surface" passage 378 in order to sweep away the chemical liquid.

Next, it is carried out to lower the inner cup 385 and start the rinsing process on both sides of the wafer W. The processing-liquid nozzle 351 expels the deionized water toward the supply hole 340. The deionized water, which has been supplied from the hole 340 to the vicinity of the center of the upper surface of the wafer W, flows to the periphery due to the centrifugal force. Further, the deionized water is supplied through the "lower-surface" passage 378, as well. In this way, the rinsing process on both sides of the wafer W is accomplished. Owing to the formation of narrow gaps between the top plate 290 and the wafer W and also between the under plate 370 and the wafer W, it is possible to interpose the deionized water only therebetween, whereby the wafer W can be processed with a small quantity of chemical liquid. Additionally, at the same time of the rinsing process for the wafer W, the lower surface of the top plate 290 and the upper surface of the under plate 370 may be cleaned with the deionized water. At the rinsing process, it is carried out to rotate the spin chuck 260, the wafer W and the top plate 290 at high speed in comparison with the rotation at the chemical processing.

After completing the rinsing process on both sides of the wafer W, it is executed to stop the ejection of the deionized water through the processing-liquid nozzle 351 and the "lower-surface" passage 378 and further move the processing-fluid supplier 280 into the nozzle chamber 277. Further, by rotating the spin chuck 260, the deionized water is shaken off from the spin chuck 260, the wafer W, the top plate 290 and the under plate 370 and further drained into the outer chamber 246.

Next, the top plate 290 is separated from the spin chuck 260 in order to supply the mixed fluid to the upper surface of the wafer W through the two-fluid mixing nozzle 355. For this, the rotations of the wafer W, the spin chuck 260 and the top plate 290 are stopped. Then, the "plate-elevation" supporting members 310 are lowered against the top plate 290 to engage the members 310 with the engagement parts 313 respectively. Continuously, the top plate 290 is elevated together with the "plate-elevation" supporting members 310. With the rise of the top plate 290, the engagement convex members 295 are elevated away from the engagement concave members 297. In this way, it is carried out to raise the top plate 290 away from the wafer W, defining a space enough to move the two-fluid mixing nozzle 355 between the lower surface of the top plate 290 and the upper part of the spin chuck 260.

Subsequently, it is executed to move the two-fluid mixing nozzle 355 to the upside of the wafer W. Next, as shown in FIG. 21, the spin chuck 260 and the wafer W are rotated in a body while allowing the nozzle 355 to expel the mixed fluid. The two-fluid mixing nozzle 355 moves at least from the center of the upper surface of the rotating water W to the periphery. While, the deionized water is supplied through the "lower-surface" passage 378.

After processing the wafer W with the mixed fluid, the drying process using $N_2$-gas for dry is performed. In detail, it is carried out to move the dry-gas nozzle 357 at least from the center of the rotating water W to the periphery while allowing the nozzle 357 to expel $N_2$-gas for dry. While, the other $N_2$-gas is supplied to the lower surface of the wafer W through the "lower-surface" passage 378. During drying the wafer W, it is rotated at high speed in comparison with the rotating speed at the rinsing process. Noted that, it may be performed prior to the supply of $N_2$-gas for dry to supply $N_2$-gas for purge through the purge-gas nozzles 382 in order to establish the atmosphere of $N_2$-gas in the outer chamber 246. In this way, if such a drying process that $N_2$-gas for dry expels the deionized water from the wafer's center to the periphery is performed under the atmosphere of $N_2$-gas, it becomes possible to prevent an occurrence of water-marks on the wafer W. Of course, without limiting to the drying process only, the supply of $N_2$-gas via the purge-gas nozzles 382 may be carried out since the previous process, for example, the chemical processing, the sequent rinsing process or the like. In this view, it is desirable to always form the downflow (or purge) of $N_2$-gas in the outer chamber 246.

After completing the drying process, the rotations of the wafer W, the spin chuck 260 and the top plate 290 are stopped. Next, it is carried out to move the processing-fluid supplier 280 into the nozzle chamber 277 and further lower the under plate 370 to its withdrawal position. Thereafter, the wafer Wis discharged from the substrate cleaning unit 212. In detail, the"outer-chamber" mechanical shutter 253 opens and the wafer transfer unit 218 makes the transfer arm 234 enter into the outer chamber 246 to support the lower surface of the wafer W. On the other hand, it is carried out to release the wafer W from the holding members 270 and further support the lower surface of the wafer W by the support pins 271. Next, the transfer arm 234 receives the wafer W from the support pins 271. In this way, it is executed to remove the holding of the spin chuck 260 for the wafer W. Thereafter, the transfer arm 234 carrying the wafer W leaves the unit 212. According to the substrate cleaning unit 212, since the wafer W and the top plate 290 are integrally rotated owing to the spin chuck 260, there is no need to provide an exclusive rotating mechanism for the top plate 290 besides the motor 272. Accordingly, the particles produced from the rotating mechanisms can be reduced in comparison with the conventional substrate processing apparatus. Further, it is possible to reduce the installation cost for the rotating mechanisms remarkably. Further, since no elevating mechanism (e.g. rotating mechanism, cylinder) is arranged above the held wafer W, it is possible to restrain the influence of particles on the wafer W.

Additionally, since a narrow gap can be formed between the top plate 290 and the wafer W stably when lowering the top plate 290, it is possible to perform an effective processing on the wafer W. It is possible to prevent the processing fluids (e.g. chemicals, rinsing liquids, etc.) from falling from the processing-fluid supplier 280 onto the wafer W. On condition of separating the top plate 290 from the spin chuck 260, it is possible to rotate the spin chuck 260 in integral with the wafer W and also possible to transfer the processing-liquid nozzle 351 and the two-fluid mixing nozzle 355 into the space between the upper surface of the wafer W and the lower surface of the top plate 290. Thus, it is possible to carry out the method of processing the wafer W while rotating the top plate 290 together with the wafer W and the method of transferring the nozzles 351, 355 to the upside of the wafer W to supply the processing fluids.

We have enumerated another preferred embodiment in illustration of the present invention; nevertheless the present invention is applicable to not only the above-mentioned substrate cleaning apparatus to which the processing liquids are supplied, but also a substrate processing apparatus for the other treatments for the substrate except cleaning the substrate. Additionally, a substrate as the object to be processed is not limited to a semiconductor wafer only. Thus, the semiconductor may be replaced with the other substrate, for example, substrate for LCD glass, CD substrate, print base plate, ceramic substrate, etc.

Although the above-mentioned substrate cleaning apparatus is provided with two engagement convex members 295 and two engagement concave members 297, the apparatus may be equipped with three or more engagement convex members 295 and the same number of engagement concave members 297, providing three or more engagements therebetween. Then, it is possible to stabilize the engagement between the spin chuck 260 and the top plate 290 furthermore, whereby the integral rotation there between can be further stabilized.

Figure 23:
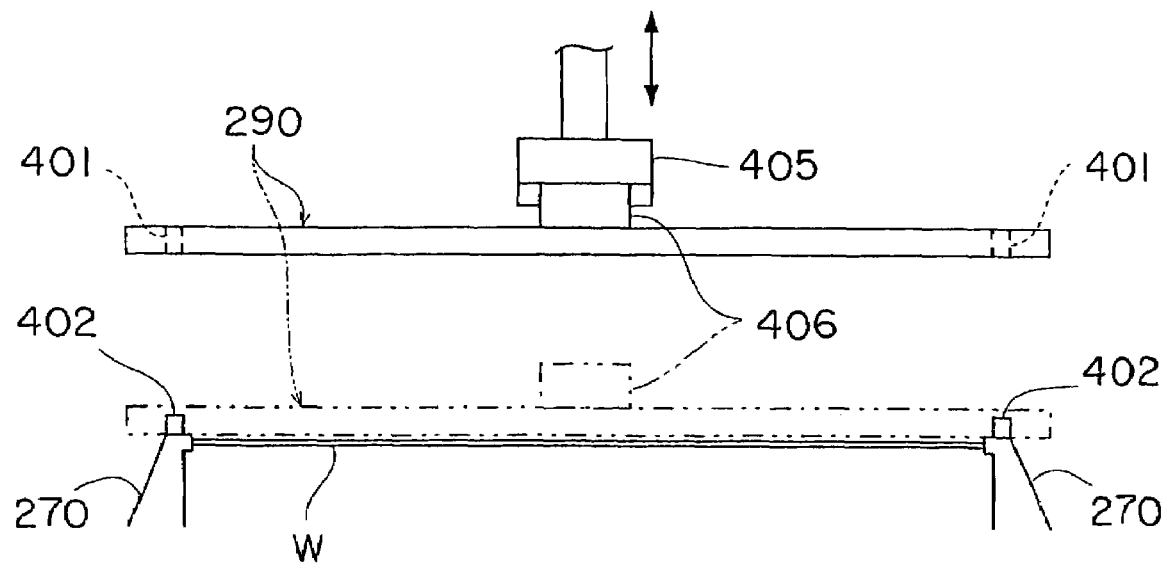
FIG. 23 is an explanatory view explaining a clamp mechanism provided in a top-plate elevating mechanism, an engagement concave part and an engagement convex part in accordance with another embodiment of the invention.

As for the engagement between the top plate 290 and the spin chuck 260, either one of the top plate 290 and the spin chuck 260 has only to be provided with engagement concave parts (recesses) while the other one is provided with engagement convex parts (projections). For instance, as shown in FIG. 23, engagement concave parts 401 are formed on the lower surface of the top plate 290, while engagement convex members 402 are mounted on the plural holding members 270 respectively. In this case, it becomes possible to narrow a clearance between the upper surface of the wafer W and the lower surface of the top plate 290 furthermore.

In the modification, magnets may be employed to engage the top plate 290 with the spin chuck 260. For example, there are provided magnets (not shown) on the lower surfaces of the engagement convex members 295 and on the bottoms of the recesses 298 (see FIG. 16) of the engagement concave members 297, as well. In this arrangement, owing to attraction of the magnets, the engagement convex members 295 are engaged with the engagement concave members 297 respectively, allowing the top plate 290 to be supported by the spin chuck 260. Additionally, the apparatus may include one or more sensors (also not shown) for detecting the engagement of the top plate 290 with the spin chuck 260. For example, there are provided sensors that can detect whether the lower surfaces of the engagement convex members 295 abut on the bottoms of the recesses 298 of the engagement concave members 297 respectively. Then, owing to the provision of the sensors, the engagement between the members 295 and the members 297 can be accomplished reliably.

Figure 24:
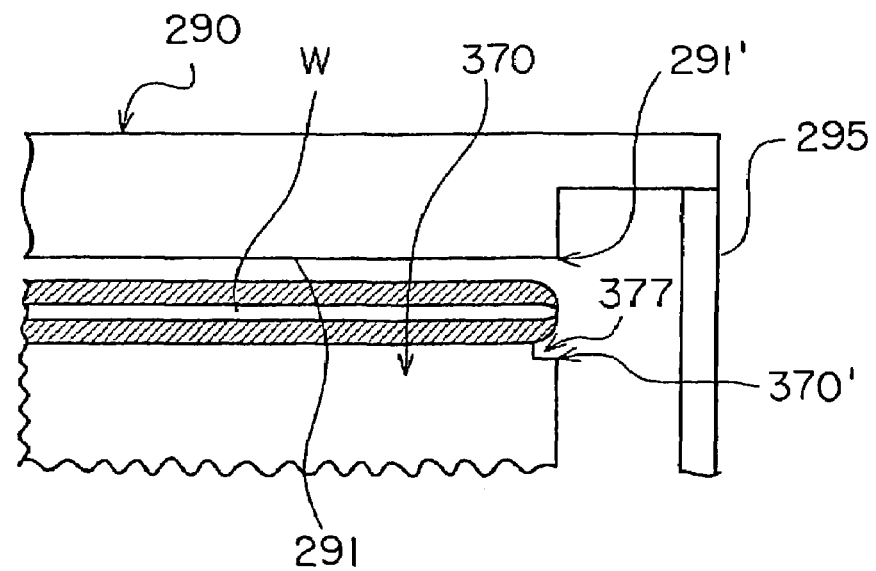
FIG. 24 is an explanatory view explaining a processing method to form a gap between the top plate and a liquid film.

Here, the chuck plate 265 may be provided with multiple groups of engagement concave members, each group at a different level from the above engagement concave members 297. In this case, by selecting any one of the multiple groups of engagement concave members to be engaged with the engagement convex members 295, it becomes possible to control a width of the gap between the lower surface of the top plate 290 and the upper surface of the wafer W, as a plural. For example, at two positions in the periphery of the chuck plate 265, there are provided second engagement concave members which can engage with the engagement convex members 295 at higher positions than those of the existing engagement concave members 297. That is, the chuck plate 265 includes a first group of two engagement concave members 297 and a second group of two second engagement concave members mentioned above. In connection, it is established that the engagement between the engagement convex members 295 and the engagement concave members 297 produces the above gap having a width of the order of e.g. 1 mm, while the engagement between the engagement convex members 295 and the second engagement concave members produces the gap having a width of the order of e.g. 5 mm. That is, when engaging the engagement convex members 295 with the second engagement concave members, there can obtained a gap between the top plate 290 and the wafer W, whose width is larger than that in case of engaging the engagement convex members 295 with the engagement concave members 297. In this way, since the gap is adjustable in width, it is possible to perform one process to bring the lower surface of the top plate 290 in contact with a chemical membrane on the upper surface of the wafer W and another process to bring the lower surface of the top plate 290 in non-contact with the chemical membrane. In performing the "high-temperature" processing, if bringing the top plate 290 in contact with the chemical membrane, it is likely that the temperature of the membrane comes down. Under such a situation, it is desirable to engage the engagement convex members 295 with the second engagement concave members, defining a gap between the top plate 290 and the membrane, as shown in FIG. 24. Then, owing to the arbitration of airspace between the top plate 290 and the membrane, it is possible to prevent the membrane from dropping in temperature. In connection, if the top plate 290 approaches the membrane, the arrangement has an effect to prevent the chemical liquid from vaporizing.

Alternatively, the top plate 290 may be provided with multiple groups of engagement convex members, each group at a different level from the engagement convex members 295. In this case, by selecting any one of the multiple groups of engagement convex members to be engaged with the engagement concave members 297, it becomes possible to control a width of the gap between the lower surface of the top plate 290 and the upper surface of the wafer W, as a plural. For example, at two positions in the periphery of the top plate 290, there are provided second engagement convex members which are longer than the engagement convex members 295 respectively. Also in this case, it is established that the engagement between the engagement concave members 297 and the engagement convex members 295 produces the above gap having a width of the order of e.g. 1 mm, while the engagement between the engagement concave members 297 and the second engagement convex members produces the gap having a width of the order of e.g. 5 mm. Since the gap is adjustable in width, it is also possible to perform one process to bring the lower surface of the top plate 290 in contact with a chemical membrane on the upper surface of the wafer W and another process to bring the lower surface of the top plate 290 in non-contact with the chemical membrane.

In the modification, as shown in FIG. 23, the "top-plate" elevating mechanism 300 may be equipped with a clamp mechanism 405. The shown clamp mechanism 405 is formed to hold a projection 406 on the top plate 290. The clamp mechanism 305 is movable up and down by the "top-plate" elevating mechanism 300. In this modification, on condition that the top plate 290 engages with the spin chuck 260, it is performed to allow the clamp mechanism 405 to hold and release the projection 406. In the further modification, although it is not shown in the figure, the top plate 290 may be provided, around the supply hole 340, with a cylindrical part which stands perpendicularly to the upper surface of the plate 290 to form the above projection 406. In this case, the clamp mechanism 405 will abut on the outer wall of the cylindrical part in order to hold the projection 406.

In the modification, the processing-liquid nozzle 351 may be inclined to the top plate 290. In this case, the nozzle 352 is arranged so as to have its lowermost point over the tapered part 342 of the supply hole 340. In operation, the processing-liquid nozzle 351 expels the processing liquid obliquely to the wafer' center through the supply hole 340. After stopping the supply of the chemical liquid (or the rinsing liquid) and before shifting the nozzle 351 from the upside of the supply hole 340, even if the processing liquid remaining in the nozzle 351 falls from the lowermost point, the tapered part 342 about the supply hole 340 could receive the droplets falling from the nozzle 351.

In the modification, the processing-liquid nozzle 351 may be constructed so as to supply hydrofluoric acid (HF), allowing the ejected processing liquid to be specified, among the SC-1 liquid, the deionized water and HF, by no-shown switching means. We now describe a cleaning process for the wafer W while using the SC-1 liquid as the first chemical liquid and the HF-liquid as the second chemical liquid.

First of all, the chemical processing using the SC-1 liquid is performed. As shown in FIG. 20, it is executed to bring the top plate 290 and the under plate 370 close to both sides of the wafer W. Then, the processing-liquid nozzle 351 expels the SC-1 liquid toward the supply hole 340 thereby to form "SC-1 liquid" membranes on both sides of the wafer W and successively, it are rotated at low speed for a predetermined period. On completion of the SC-1 process on both sides of the wafer W, the SC-1 liquid is thrown off from the spin chuck 260, the wafer W, the top plate 290 and the under plate 370 by rotating them. Then, the SC-1 liquid is drained into the inner cup 385. Next, the inner cup 385 is lowered and the deionized water is supplied from the nozzle 351 into the supply hole 340, performing the rinsing process on both sides of the wafer W. Thereafter, the deionized water is thrown off from the spin chuck 260, the wafer W, the top plate 290 and the under plate 370 by rotating the spin chuck 260. Then, the deionized water is drained into the outer chamber 246. Subsequently, the rotations of the wafer W, the spin chuck 260 and the top plate 290 are stopped. As shown in FIG. 21, the top plate 290 is elevated away from the spin chuck 260. In succession, the mixed fluid is supplied from the two-fluid mixing nozzle 355 onto the upper surface of the wafer W. The mixing fluid for the wafer W is drained into the outer chamber 246.

Thereafter, the cleaning process with the HF-liquid is carried out. First, as shown in FIG. 20, the rotations of the wafer W and the spin chuck 260 are stopped. Then, the top plate 290 is lowered close to the wafer W and engaged with the spin chuck 260. The "plate-elevation" supporting members 310 are separated from the top plate 290 for withdrawal. On the other hand, the under plate 370 is close to the wafer W. The processing-fluid supplier 280 transfers from the inside of the nozzle chamber 77 to the upside of the top plate 290 and further, the processing-liquid nozzle 351 expels HF as the chemical liquid to the wafer W. Through the supply hole 340, HF-liquid is supplied to the vicinity of the wafer's center. It is executed to rotate all of the spin chuck 260, the wafer W held by the chuck 260 and the top plate 290 in a body. The HF-liquid in the vicinity of the wafer's center flows toward the periphery of the wafer W due to its centrifugal force. Additionally, the "lower-surface" passage 378 supplies the HF-liquid as the chemical liquid to form liquid membranes of HF on both sides of the wafer W. Next, stopping the supply of the HF-liquid through the processing-liquid supplier 280 and the "lower-surface" passage 378, the wafer W is rotated for a predetermined period at a low speed such that the liquid membranes on both sides of the wafer W do not collapse. Thereafter, with the rotation of the spin chuck 260, the HF-liquid is thrown off from the spin chuck 260, the wafer W, the top plate 290 and the under plate 370 and successively discharged into the outer chamber 246.

Next, the rinsing process on both sides of the wafer W is carried out by using the deionized water supplied from the nozzle 351 through the supply hole 340. By integrally rotating the spin chuck 260, the wafer W and the top plate 290 at a high speed, the deionized water is removed from the spin chuck 260, the wafer W, the top plate 290 and the under plate 370. That is, the high-speed rotation allows the wafer W to be dried. Thereafter, the top plate 290 is elevated and separated from the spin chuck 260, while the under plate 370 is lowered. In this way, the wafer W is discharged from the substrate cleaning unit 212.

In forming the chemical membranes of SC-1, HF, etc. on the wafer W, there is established a situation that the whole wafer W is enveloped in the chemical liquid between the top plate 290 and the under plate 370. In detail, it is carried out to extend the chemical liquid supplied on both sides of the wafer W up to the circumference face of the wafer W so that not only both sides of the wafer W but its circumference face has a chemical membrane formed thereon, as shown in FIG. 16. Then, since the circumference face of the wafer W is processed by the chemical liquid, it is possible to improve the quality of the wafer W after procession. Note, if the under surface 291 of the top plate 290 has its periphery 291' positioned somewhat outside the upper edge of the wafer W and the upper surface of the under plate 370 has its periphery 370' positioned somewhat outside the lower edge of the wafer W, the chemical membrane can be formed between the periphery 291' and the periphery 370', allowing the periphery of the wafer W to be covered with the liquid membrane easily. Alternatively, it may be carried out to maintain the chemical supply through the processing-fluid supplier 280 and the "lower-surface" passage 378 even after forming the liquid membrane, performing the chemical processing while forming the liquid membrane flowing from the wafer's center to the periphery on both sides of the wafer W.

Regarding the formation of a chemical membrane of SC-1, HF, etc. on the upper sur face of the wafer W, it is also possible to form the chemical membrane in spite of separating the top plate 290 from the upper surface of the wafer W. For example, on condition that the top plate 290 is apart from the upper surface of the wafer W, the processing-fluid supplier 280 is driven to the upside of the wafer W. Then, by transferring the processing-liquid nozzle 351 at least from the wafer's center to the periphery while rotating the wafer W and the spin chuck 260 in a body softly, it is carried out to supply the whole upper surface of the wafer W with the SC-1 liquid via the nozzle 351. After the formation of the SC-1 membrane on the upper surface of the wafer W in the above way, the processing-fluid supplier 280 takes shelter from the upside of the wafer W and further, the top plate 290 is lowered so that its lower surface comes in contact with the liquid membrane. Owing to this contact, it becomes possible to establish a state that only the SC-1 liquid is interposed between the top plate 290 and the upper surface of the wafer W. Alternatively, it may be carried out to make the top plate 290 approach the wafer W while leaving a gap between the lower surface of the plate 290 and the upper surface of the membrane, as shown in FIG. 24. Then, the positioning of the top plate 290 takes an effect to prevent evaporation of the chemical liquid from the wafer W.

The rinsing process and the drying process may be performed on condition that the top plate 290 is apart from the upper surface of the wafer W. For instance, it may be carried out to transfer the two-fluid nozzle 355 at least from the wafer's center to the periphery while rotating the wafer W and the spin chuck 260 in a body and further carried out to supply the whole upper surface of the wafer W with the deionized water or $N_2$-gas for dry.

According to the substrate processing apparatus and method of the present invention, it is possible to reduce the number of rotating mechanisms, whereby particles produced from these rotating mechanisms can be decreased. Additionally, the substrate processing apparatus can be small-sized to save the installation cost required for the mechanisms. Since no source of the outbreaks of particles is present above the substrate, it is possible to reduce the influence of particles on the substrate. Further, as a gap between the substrate and the top-face member can be narrowed and produced stably, it is possible to carry out an effective processing.

According to the substrate processing apparatus and method of the present invention, there can be performed a method of engaging the top-face member with the spin chuck and processing the substrate while rotating the top-face member, the spin chuck and the substrate in one body and another method of separating the top-face member from the spin chuck and transferring the processing-fluid nozzle between the top-face member and the substrate thereby supplying it with the processing fluid.

What is claimed is:

1. A substrate processing apparatus for processing a substrate with a processing fluid, comprising:

a spin chuck adapted to hold and rotate the substrate, the spin chuck having a base member arranged so as to be located below the substrate held by the spin chuck, and a holding member connected to the base member to support the substrate;

a top-face member arranged so as to oppose the substrate held by the spin chuck, and adapted to move vertically between a first position in which the top-face member is adjacent to the substrate held by the spin chuck and a second position in which the top-face member is remote from the substrate held by the spin chuck;

a first nozzle adapted to supply a first processing fluid to the substrate held by the spin chuck;

a joint connecting the top-face member to the base member, the joint being configured to prohibit relative rotation between the spin chuck and the top-face member whereby the top-face member is driven by the spin chuck for integral rotation with the spin chuck when the spin chuck rotates, and the joint being configured to allow relative vertical movement between the spin chuck and the top-face member; and an elevating mechanism having a vertically-movable, push-up member, the push-up member being adapted to move upward to its raised position to place the top-face member in the second position where the push-up member supports the top-face member, and being adapted to move downward to its lowered position to place the top-face member in the first position where the push-up member is remote from the top-face member to allow the top-face member to rotate integral with the spin chuck without colliding with the push-up member;

wherein the joint comprises a guide pin arranged on the base member and a top-face member supporting member for supporting the top-face member above the substrate, the top-face member supporting member being slidable against the guide pin.

2. A substrate processing apparatus as claimed in claim 1, further comprising a rotating mechanism for rotating the base member, wherein the rotating mechanism and the top-face member elevating mechanism are arranged below the substrate.

3. A substrate processing apparatus as claimed in claim 1, further comprising a second nozzle adapted to supply a second processing fluid to the substrate, wherein the top-face member is provided, at a center thereof, with a through-hole which allows the second processing fluid supplied from the second nozzle located above the top-face member to be supplied onto the substrate.

4. A substrate processing apparatus as claimed in claim 3, wherein the second nozzle is arranged such that a lowermost point thereof is located outside the through-hole in a plan view, and the second nozzle is configured to jet the second processing fluid so that it passes obliquely through the through-hole of the top-face member to be supplied onto the substrate; and the top-face member has an inclined portion thereof right below the lowermost point of the second nozzle, thereby to prevent the second processing fluid possibly dripping down from the second nozzle from flowing into the through-hole when the second nozzle stops jetting the second processing fluid.

5. A substrate processing apparatus as claimed in claim 1, further comprising a purge-gas nozzle for supplying an upper part of the top-face member with a purge gas.

6. A substrate processing apparatus as claimed in claim 1, further comprising an exhaust port which opens at a level corresponding to that of the substrate held by the spin chuck to discharge an atmosphere around the substrate flowing radially outward from the substrate.

7. A substrate processing apparatus for processing a substrate with a processing fluid, comprising:
   a spin chuck adapted to hold and rotate the substrate, the spin chuck having a base member arranged so as to be located below the substrate held by the spin chuck, and a holding member connected to the base member to support the substrate;
   top-face member arranged so as to oppose the substrate held by the spin chuck, and adapted to move vertically between a first position in which the top-face member is adjacent to the substrate held by the spin chuck and a second position in which the top-face member is remote from the substrate held by the spin chuck; and
   a first nozzle adapted to supply a first processing fluid to the substrate held by the spin chuck, wherein
   the top-face member is connected to the base member of the spin chuck through a joint which allows relative vertical movement between the spin chuck and the top-face member while prohibiting relative rotation between the spin chuck and the top-face member, whereby the top-face member is driven by the spin chuck for integral rotation with the spin chuck when the spin chuck rotates,
   the apparatus further comprising
   a top-face member elevating mechanism for moving the top-face member down to the first position and also moving the top-face member up to the second position;
   a guide pin arranged on the base member, and
   a top-face member supporting member for supporting the top-face member above the substrate, the top-face member supporting member being slidable against the guide pin,
   wherein the top-face member elevating mechanism includes a push-up member for pushing the top-face member supporting member upward.

8. A substrate processing apparatus for processing a substrate with a processing fluid, comprising:
   a spin chuck adapted to hold and rotate the substrate, the spin chuck having a base member arranged so as to be located below the substrate held by the spin chuck, and a holding member connected to the base member to support the substrate;
   a top-face member arranged so as to oppose the substrate held by the spin chuck, and adapted to move vertically between a first position in which the top-face member is adjacent to the substrate held by the spin chuck and a second position in which the top-face member is remote from the substrate held by the spin chuck;
   a first nozzle adapted to supply a first processing fluid to the substrate held by the spin chuck, and
   a second nozzle adapted to supply a second processing fluid to the substrate,
   wherein the top-face member is provided, at a center thereof, with a through-hole which allows the second processing fluid supplied from the second nozzle to be located above the top-face member to be supplied onto the substrate,
   further wherein the top-face member is connected to the base member of the spin chuck through a joint which allows relative vertical movement between the spin chuck and the top-face member while prohibiting relative rotation between the spin chuck and the top-face member, whereby the top-face member is driven by the spin chuck for integral rotation with the spin chuck when the spin chuck rotates, and
   wherein
   the second nozzle is arranged such that a lowermost point thereof is located outside the through-hole in a plan view, and the second nozzle is configured to jet the second processing fluid so that it passes obliquely through the through-hole of the top-face member to be supplied onto the substrate, and
   the top-face member has an inclined portion thereof right below the lowermost point of the second nozzle, thereby to prevent the second processing fluid possibly dripping down from the second nozzle from flowing into the through-hole when the second nozzle stops jetting the second processing fluid.

\* \* \* \* \*

UNITED STATES PATENT AND TRADEMARK OFFICE
CERTIFICATE OF CORRECTION

| | |
|---|---|
| PATENT NO. | : 7,387,131 B2 |
| APPLICATION NO. | : 10/353015 |
| DATED | : June 17, 2008 |
| INVENTOR(S) | : Osamu Kuroda et al. |

It is certified that error appears in the above-identified patent and that said Letters Patent is hereby corrected as shown below:

On the title page, please delete printed field (75) and insert therefor:

--(75), Inventors:  Osamu Kuroda, Tosu (JP)
　　　　　　　　　　Hiroki Taniyama, Tosu (JP)--

Signed and Sealed this

Tenth Day of February, 2009

JOHN DOLL
*Acting Director of the United States Patent and Trademark Office*